United States Patent
Kikuta et al.

(10) Patent No.: US 9,607,410 B2
(45) Date of Patent: Mar. 28, 2017

(54) METHOD AND DEVICE FOR FORMING SURFACE TREATMENT DATA

(75) Inventors: Mamoru Kikuta, Saitama (JP);
Kenjiro Miura, Hamamatsu (JP);
Daijiro Uzuyama, Hamamatsu (JP)

(73) Assignees: CALSONIC KANSEI CORPORATION, Saitama (JP);
NATIONAL UNIVERSITY CORPORATION SHIZUOKA UNIVERSITY, Shizuoka (JP)

( * ) Notice: Subject to any disclaimer, the term of this patent is extended or adjusted under 35 U.S.C. 154(b) by 176 days.

(21) Appl. No.: 14/003,475

(22) PCT Filed: Oct. 24, 2011

(86) PCT No.: PCT/JP2011/074432
§ 371 (c)(1),
(2), (4) Date: Nov. 12, 2013

(87) PCT Pub. No.: WO2012/120724
PCT Pub. Date: Sep. 13, 2012

(65) Prior Publication Data
US 2014/0063038 A1 Mar. 6, 2014

(30) Foreign Application Priority Data
Mar. 8, 2011 (JP) .................. 2011-050153

(51) Int. Cl.
*G06T 11/00* (2006.01)
*G06F 17/50* (2006.01)
(Continued)

(52) U.S. Cl.
CPC ........ *G06T 11/001* (2013.01); *G06F 17/5018* (2013.01); *G06T 15/04* (2013.01);
(Continued)

(58) Field of Classification Search
None
See application file for complete search history.

(56) References Cited

U.S. PATENT DOCUMENTS 4,855,934 A * 8/1989 Robinson ............... G06T 15/04
345/419
5,428,718 A * 6/1995 Peterson ................. G06T 17/20
345/423

(Continued)

FOREIGN PATENT DOCUMENTS

CN 1141378 A 1/1997
JP 07-241909 A 9/1995
(Continued)

OTHER PUBLICATIONS

Date, H., et al., "A Textured Shape Design System using Mesh Modeling," IPSJ SIG Notes 2005; vol. 2005(44):pp. 55-60.

(Continued)

*Primary Examiner* — Xiao Wu
*Assistant Examiner* — Yu Chen
(74) *Attorney, Agent, or Firm* — Kenealy Vaidya LLP

(57) ABSTRACT

A surface of a product is divided into a plurality of patches and a polygon mesh is formed. Sequences of vertexes on borderlines between the adjacent patches are allowed to correspond to each other, and then, a texture is mapped on each of patch units. The vertexes of the polygon mesh displaced in accordance with the mapped texture are connected together to form crimp applied polygon data for each of the patch units. In each of processing stages, since data to be processed can be limited to data of the two adjacent patches at the maximum, a practicable range of a computer is not exceeded due to the restriction of capacity of an operation memory.

16 Claims, 28 Drawing Sheets

(51) Int. Cl.
*G06T 15/04* (2011.01)
*G06T 19/20* (2011.01)

(52) U.S. Cl.
CPC .... *G06T 19/20* (2013.01); *G05B 2219/34171* (2013.01); *G06T 2219/2021* (2013.01)

(56) References Cited

U.S. PATENT DOCUMENTS

| | | | |
|---|---|---|---|
| 5,744,081 A | 4/1998 | Tanigawa et al. | |
| 5,995,109 A * | 11/1999 | Goel | G06T 17/20 345/419 |
| 6,750,873 B1 * | 6/2004 | Bernardini et al. | 345/582 |
| 7,133,044 B2 * | 11/2006 | Maillot | G06T 17/20 345/419 |
| 7,532,213 B2 * | 5/2009 | Sfarti | G06T 17/30 345/423 |
| 8,786,600 B1 * | 7/2014 | Cantlay | 345/423 |
| 2003/0148802 A1 | 8/2003 | Takahama et al. | |
| 2003/0164838 A1 * | 9/2003 | Guo | G06T 11/001 345/582 |
| 2012/0001908 A1 * | 1/2012 | Kikuta et al. | 345/419 |

FOREIGN PATENT DOCUMENTS

| | | |
|---|---|---|
| JP | 8-506671 A | 7/1996 |
| JP | 09-006828 A | 1/1997 |
| JP | 3429271 B2 | 5/2003 |
| JP | 2003-288609 A | 10/2003 |
| JP | 2004-358662 | 12/2004 |
| JP | 2010-238215 A | 10/2010 |
| JP | 2011-186845 A | 9/2011 |
| WO | 94/17486 A1 | 8/1994 |
| WO | WO 2010103942 A1 * | 9/2010 |

OTHER PUBLICATIONS

International Search Report and Written Opinion for PCT/JP2011/074432 (Jan. 24, 2012).
Chinese Office Action for the related Chinese Patent Application No. 201180069137.7 dated Oct. 10, 2015.
The extended European Search Report for the related European Patent Application No. 11860503.9 dated Nov. 23, 2015.
Lin Liang et al.; "Real-Time Texture Synthesis by Patch-Based Sampling"; ACM Transactions on Graphics (TOG); ACM, US; vol. 20, No. 3, Jul. 2001; pp. 127-150; XP002541110.

* cited by examiner

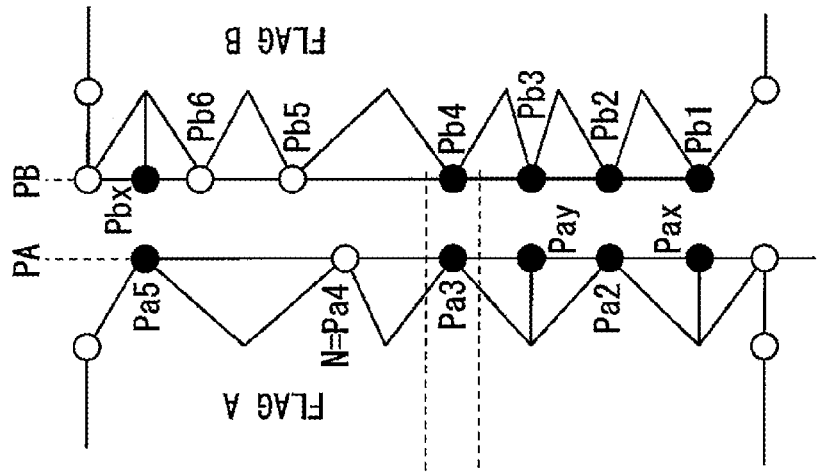
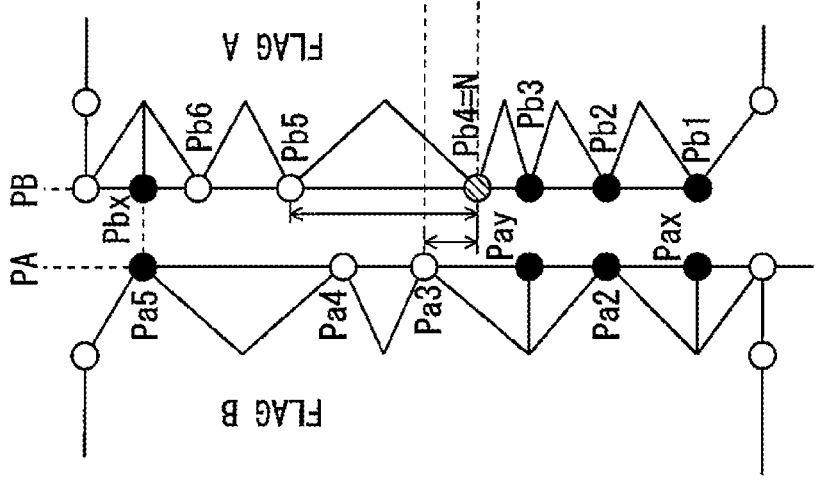
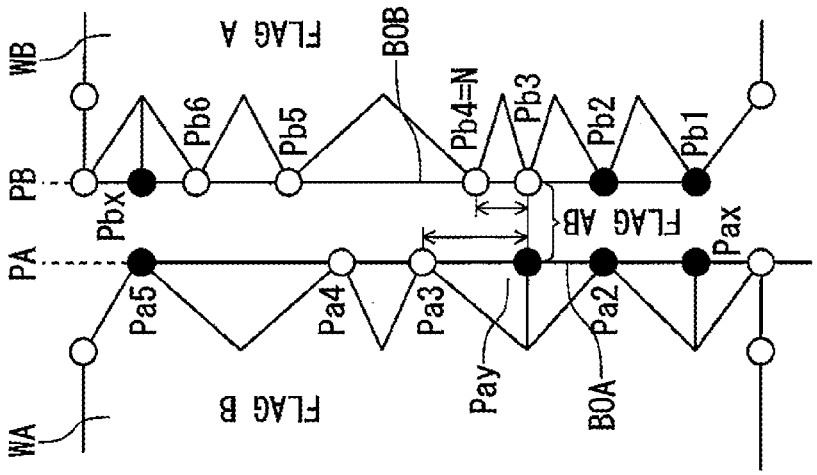
FIG. 17G
FIG. 17H
FIG. 17I

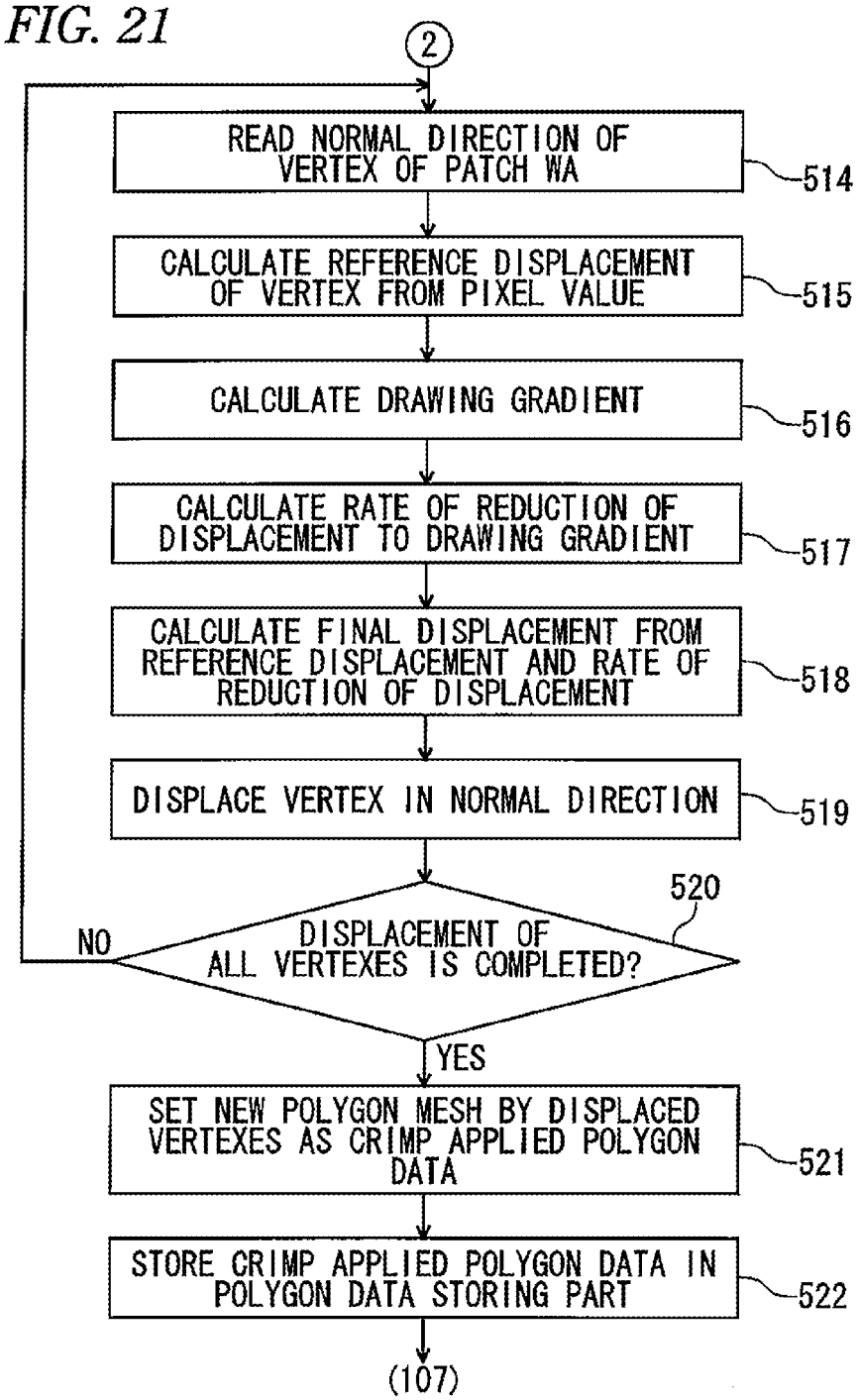

METHOD AND DEVICE FOR FORMING SURFACE TREATMENT DATA

This application is a U.S. national phase filing under 35 U.S.C. §371 of PCT Application No. PCT/JP2011/074432, filed Oct. 24, 2011, and claims priority under 35 U.S.C. §119 to Japanese patent application number JP2011-050153 filed on Mar. 8, 2011, the entireties of which are incorporated herein by reference.

TECHNICAL FIELD

The present invention relates to a method and a device for forming surface treatment data that forms a crimp pattern on the surface of a resin product.

BACKGROUND ART

On the surfaces of domestic electric products, writing materials or interior articles for a motor vehicle, crimps are applied for the various purposes such as an improvement of an outward appearance or a tactile impression, a prevention of glare, a prevention of slip or the like. As patterns of the crimps, are used patterns of various microscopic forms such as a skin, a woody texture, a rocky surface, a sandy texture, a crepe texture, a geometric pattern.

In order to form these crimps on the surfaces of the resin products, in place of a usual etching method or an electrocasting method, JP-A-7-241909 or JP-A-2004-358662 proposes a technique that treatment data is used to apply the crimps which is formed in such a way that depth of a surface configuration is converted to image data represented by the densities of 256 gradations from surface measured values obtained by reading the surface configuration of a skin model to form the treatment data by a computer.

When the treatment data is formed from crimp shaped data, in order to avoid a skew-ness from arising in the crimps in an inclined surface of a three-dimensional object, for instance, modeling soft is provided which uses a box cell data conversion that box cells are stacked on curved surfaces of the product in accordance with the densities corresponding to the depths of the crimps in the image data to form the crimps in a normal direction of the surface of the product.

However, in such a system, initially to convert product shaped data to box cell data, an enormous quantity of data is necessary.

Further, to the surface of the product having a continuous and complicated configuration including a plurality of curved surfaces, the crimp is formed for each of divided ranges, and after the crimp is formed, a process for a joint to an adjacent crimp form is necessary. However, a satisfactory process thereto is not yet unsolved.

Namely, it is difficult to adapt the crimps of the joint to the same form. In order to prevent the joint from outstanding, an amendment by a manual operation is necessary which requires a large number of processes. Further, since the amendment by the manual operation deforms the crimp forms to be joined together, a workmanship changes depending on the skill of an operator. Thus, an angular part is rounded and a groove or a crest is thickened or bent, so that the amendment may frequently deviate from an aim of the amendment to deteriorate an outward appearance and a quality is not stabilized. Accordingly, the fact is that an object to which the usual method is mainly applied is limited to a plane or a cylindrical surface.

PRIOR ART DOCUMENT

Patent Document

Patent Document 1: JP-A-7-241909
Patent Document 2: JP-A-2004-358662

SUMMARY OF THE INVENTION

Problems that the Invention is to Solve

Thus, the inventor et al. examine a below-described technique for forming surface treatment data so that crimps may be formed with little skew on the surface of a product even in the configuration of the product having a large Gaussian curvature or having a moderate Gaussian curvature, however, formed with many curved surfaces, which increases an area.

The inventor et al. examine below described operations.

Product shaped data defined as free curved surfaces as objects to which crimps are applied is converted to polygon meshes. One of the polygon meshes obtained by dividing the polygon meshes is set as an initial area to map texture thereon. New texture is combined with the mapped texture which is connected to the mapped texture with such a change as to satisfy a prescribed request level. Operations that new textures are mapped on adjacent areas are repeated to map the textures on all the areas. New polygon mesh data which is formed in accordance with new vertexes obtained by displacing vertexes of the polygon meshes respectively in their normal directions on the basis of the textures is determined as the surface treatment data to which the crimps are applied.

The surface treatment data is applied to an embossing roll or an embossing plate as the crimps by, for instance, an NC working machine such as a machining center or a laser beam machine. The crimps are transferred to a sheet shaped product by using the embossing roll or the embossing plate, so that the product to which the crimps are applied can be obtained. Otherwise, the surface treatment data is applied to a metal mold by the NC working machine such as the machining center or the laser beam machine. A resin is molded by using the metal mold to transfer the crimps applied to the metal mold to a resin product. Thus, the three-dimensional product to which the crimps are applied can be obtained. Accordingly, the inventor et al. think that even when the data is divided in an initial stage, a joint of crimp forms is smooth, and even in the case of a product configuration a surface of which is not an applicable surface, the crimps having little distortion or skew and good in outward appearance can be applied.

When the surface treatment data of the crimps is formed, the enormous quantity of data for the usual box cell data conversion does not need to be processed. However, when all of the product shaped data itself to which the crimp forms are applied is not read in a main memory of a computer, a continuity of the crimp forms to be formed cannot be held. Accordingly, when an area to which the crimp forms are applied is large, a quantity of data which needs to be processed at a time is increased. Thus, it takes much time to process the data by a limited capacity of the main memory in an inner part. Especially, when the quantity of data exceeds a quantity that the main memory can store, an external auxiliary memory such as a hard disk is temporarily used. At this time, since an access speed of the hard disk is extremely low, a processing speed is terribly lowered. The computer may be sometimes frozen. Thus, an improvement is desired so that the process may be smoothly carried out irrespective of the size of an object to which the crimp forms are applied and further that a practicability may be improved.

By considering the above-described circumstances, it is an object of the present invention, to provide a method and a device for forming surface treatment data which can apply crimps having little distortion or skew and good in outward appearance, do not cause a processing speed to be lowered even when the crimps are applied to a configuration with a large area and can be processed within a practicable range.

Means for Solving the Problems

According to the invention, there is provided a method for forming surface treatment data by a computer, including:

a polygon mesh forming process in which a polygon mesh is formed for each of patch units obtained by dividing into a plurality of parts product shaped data defined as free curved surfaces as an object to which crimps are applied;

a configuration continuity forming process in which one patch of the plurality of patches is selected as an object to be processed and the polygon mesh is allowed to be sequentially continuous between the patch as the object to be processed and the adjacent patches one by one;

a mapping process in which a texture based on texture data is mapped on the patch as the object to be processed;

a vertex displacing process in which vertexes of the patch as the object to be processed are respectively displaced in their normal directions in accordance with the texture mapped on the patch; and a crimp applied polygon mesh data forming process in which new polygon mesh data is formed in accordance with the displaced vertexes respectively, characterized in that the configuration continuity forming process to the crimp applied polygon mesh data forming process are repeated to form the surface treatment data for each of patch units including the crimp applied polygon mesh data.

The method for forming surface treatment data, wherein whether or not the vertexes on a borderline of the one patch formed as the polygon mesh are overlapped on a poly-line formed by using a sequence of vertexes on a borderline of other patch is searched in the configuration continuity forming process, and when the vertexes on the borderline of the one patch are overlapped on the poly-line, an adjacent relation is set between them.

The method for forming surface treatment data, wherein the texture data is image data in which pixel values obtained by assigning depths of crimps in two-dimensional position coordinates to the gradations of densities are taken as texture values.

The method for forming surface treatment data, wherein a texture coordinate system is set for each of the patches by using its mean normal before the mapping process, and in the mapping process, all the vertexes of the patch as the object to be processed are projected on the texture coordinate system of the patch to obtain the texture values, the vertexes located in a prescribed range in the patch as the object to be processed are projected on the texture coordinate system of the patch adjacent to the patches the object to be processed to obtain the texture values and both the texture values are mixed together.

The method for forming surface treatment data, wherein the vertexes located in the prescribed range indicate vertexes the shortest distances of which to vertexes of a borderline to the adjacent patch are situated within prescribed values.

The method for forming surface treatment data, wherein the texture values are mixed together by applying a weight in the shortest distances.

The method for forming surface treatment data, wherein positions of the vertexes on the borderlines between the patch as the object to be processed and the adjacent patch are respectively allowed to coincide with each other.

The method for forming surface treatment data, wherein for the coincidence of the vertexes, at the same position as that of the vertex on one borderline of the patch as the object to be processed and the adjacent patch, the vertex is formed on the other borderline, or the vertex on the one borderline and the vertex on the other borderline are respectively moved to the same position, so that the vertexes are allowed to coincide with each other.

The method for forming surface treatment data, wherein the vertex on the borderline to the adjacent patch as the object the shortest distance of which is obtained is identified by referring to the vertex located on the borderline of the adjacent patch.

The method for forming surface treatment data, wherein normal lines of the vertexes the positions of which are allowed to coincide with each other on the borderlines between the patch as the object to be processed and the adjacent patch are allowed to correspond to each other between the patch as the object to be processed and the adjacent patch.

The method for forming surface treatment data, wherein the normal lines of the vertexes of the patch as the object to be processed are allowed to correspond to the normal lines of the vertexes of the adjacent patch.

The method for forming surface treatment data, wherein the patch as the object to be processed is selected in order of large data quantity of the polygon meshes.

The method for forming surface treatment data, wherein the adjacent patch of the patches having the adjacent relation to the one patch as the object to be processed is selected in order of large data quantity of the polygon meshes.

Further, according to the invention, there is provided a device for forming surface treatment data including:

a data input part to which product shaped data defined as free curved surfaces of an object to which crimps are applied and texture data are inputted;

a polygon mesh forming part that forms a polygon mesh for each of patch units obtained by dividing the product shaped data into a plurality of parts;

an adjacent relation search part that searches an adjacent relation between the patches, a configuration continuity processing part that sets one patch as an object to be processed and a process is carried out for allowing the polygon mesh to be continuous between the patch as the object to be processed and the adjacent patches one by one for each combination unit including the patch as the object to be processed and the one adjacent patch;

a texture combining part that maps a texture on the patch;

a vertex displacing part that displaces vertexes of the polygon mesh of the path in their normal directions in accordance with the texture mapped on the patch; and a crimp applied polygon mesh forming part that connects the vertexes displaced by the vertex displacing part to form a crimp applied polygon mesh including crimp configurations, characterized in that data of the crimp applied polygon mesh is outputted as the surface treatment data for each of the patch units.

The device for forming surface treatment data, wherein the vertexes respectively located on borderlines between the patch as the object to be processed and the adjacent patch are allowed to coincide with each other.

The device for forming surface treatment data, wherein the texture combining part includes a texture mixing part which mixes textures together for the patch as the object to be processed located within a prescribed range from the borderlines of the patch as the object to be processed and the adjacent patch respectively in accordance with texture coordinate systems of the patch as the object to be processed and the adjacent patch.

The device for forming surface treatment data, wherein the mapping part includes a normal coincidence processing part which allows normal lines of the vertexes of the patch as the object to be processed to correspond to normal lines of the vertexes of the adjacent patch.

Advantage of the Invention

According to the method for forming surface treatment data of the present invention, initially, since the product shaped data is configured as the polygon mesh and processed as curved surface data having no thickness, a quantity of data to be processed may be reduced.

Further, since the product shaped data is divided into a plurality of patches, the crimps having little distortion or skew and good in outward appearance can be applied even to the configuration of the product the surface of which is not an applicable surface.

Especially, the configuration continuity forming process to the formation of the crimp applied polygon mesh is carried out for the patch unit as the object to be processed. Even when there is a plurality of patches adjacent to the patch as the object to be processed during the processes, the data is sequentially read and processed one by one. Accordingly, the two patches including the patch as the object to be processed and the one adjacent patch, namely, the polygon mesh data of the two patches at the maximum may be stored in the memory of a computer at a time. Thus, the data does not exceed a quantity which the memory can store, so that a processing speed of the computer is not extremely lowered and a high practicability is obtained.

According to the device for forming surface treatment data of the present invention, the process by the configuration continuity processing part to the process by the crimp applied polygon mesh forming part are carried out for the patch unit. Even when there is a plurality of patches adjacent to the patch as the object to be processed during the processes, the data is sequentially read and processed one by one. Accordingly, the two patches including the patch as the object to be processed and the one adjacent patch, namely, the polygon mesh data of the two patches at the maximum may be stored in the memory of a computer at a time. Thus, the data does not exceed a quantity which the memory can store, so that a processing speed of the computer is not extremely lowered, or a memory having an excessively large capacity does not need to be prepared and a high practicability is obtained.

BRIEF DESCRIPTION OF THE DRAWINGS

FIG. 17 is an explanatory view showing a progress of the vertex coincidence process.

FIG. 21 is a flowchart showing a detail of texture mapping and displacement mapping.

MODES FOR CARRYING OUT THE INVENTION

Now, an exemplary embodiment of the present invention will be described below.

Figure 1:
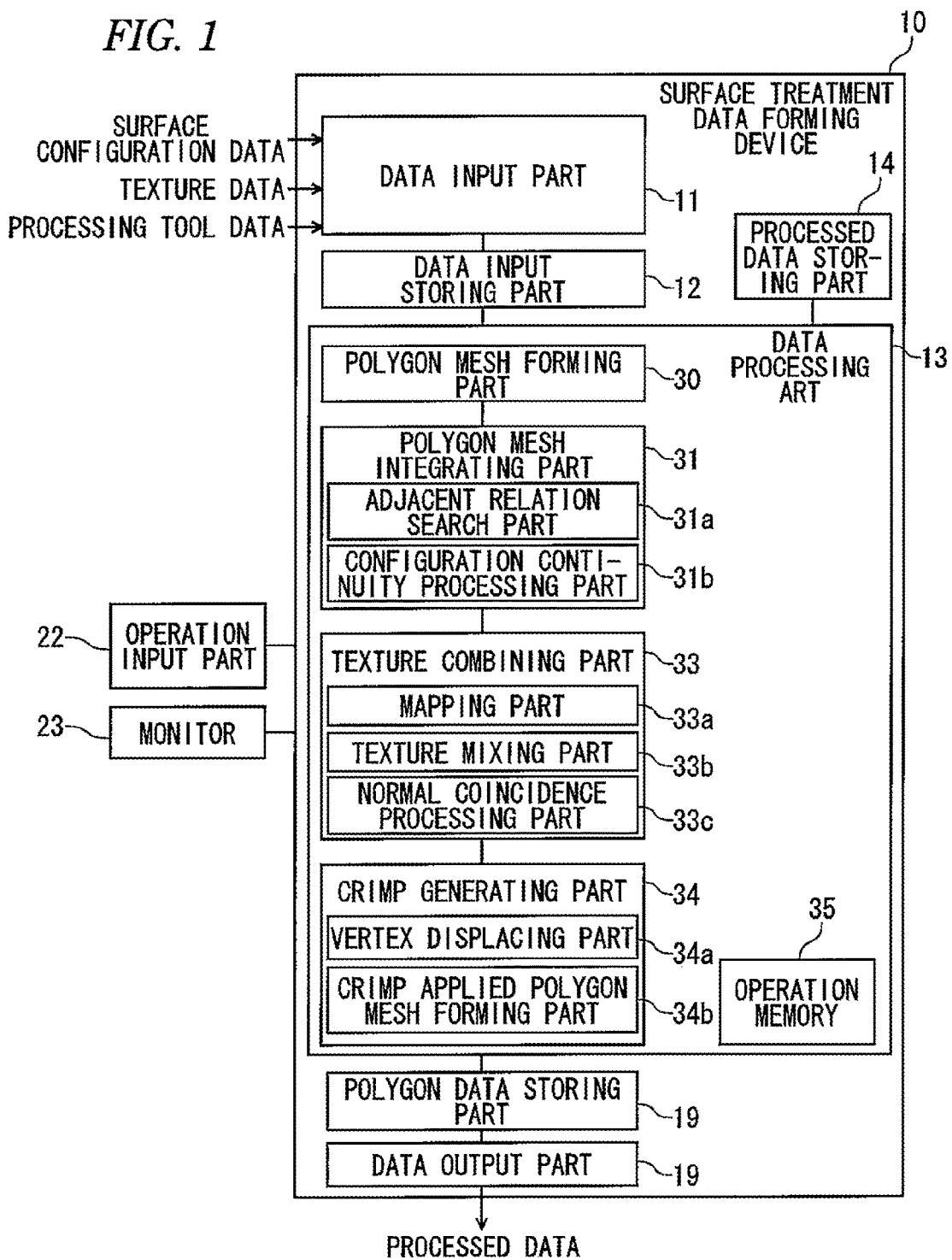
FIG. 1 is a block diagram showing a structure of a surface treatment data forming device in an exemplary embodiment.

FIG. 1 is a block diagram showing a structure of a surface treatment data forming device according to an exemplary embodiment.

The surface treatment data forming device 10 can be formed with a computer. The surface treatment data forming device 10 includes a data input part 11 to which a surface configuration of a product, texture data of crimps and processing tool data are in putted, an input data storing part 12, a data processing part 13 which generates polygon data having crimp configurations applied to curved surfaces of a surface of the product in accordance with data stored in the input data storing part 12, a polygon data storing part 19 which stores the generated polygon data, a data output part 20 which outputs the polygon data from the polygon data storing part 19 as processed data and a processed data storing part 14 formed with, for instance, a hard disk connected to the data processing part 13.

To the surface treatment data forming device 10, are connected an operation input part 22 formed with a keyboard or a jog lever and a monitor 23 which can display image data.

Surface configuration data as product shaped data inputted to the data input part 11 is defined as free curved surfaces in which most of coordinates respectively used as CAD data are expressed by a function S=F (u,v) of parameters u and v. The surface configuration data is previously formed with patch information which is divided into a plurality of curved surfaces by borderlines represented by free curves, and stored in the input data storing part 12.

As long as there is not particularly a previous notice, the borderlines include, what is called a trimming line and a borderline which defines an end edge of a product configuration and has no adjacent patch.

The surface configuration data includes an entire size of an object part of the product to which the crimps are applied (refer it to as an object to which the crimps are applied, hereinafter).

The texture data is two-dimensional gray scale image data of 256 gradations in which depths of the crimps are assigned to densities. Texture can be expressed by a small quantity of data and a data process is simplified.

The texture data is read as pixel values for a process in the data processing part 13. In the following, for convenience sake, the pixel value is also merely referred to as color or as color information.

The processing tool data includes an upper limit value of the shortest distance from a vertex on the borderline which determines a range to be weighted when the textures are mixed together and a mold opening direction of a mold of injection molding used for calculating a rate of reduction changed depending on a drawing gradient.

The data processing part 13 includes a polygon mesh forming part 30, a polygon mesh integrating part 31, a texture combining part 33, a crimp generating part 34 and an operation memory 35 (a main memory).

The polygon mesh forming part 30 forms a triangular polygon mesh having vertexes on the free curved surface for each of patches.

The polygon mesh integrating part 31 includes an adjacent relation search part 31a and a configuration continuity processing part 31b to carry out a process so that the triangular polygon meshes are smoothly connected together between the adjacent patches.

The texture combining part 33 includes a mapping part 33a, a texture mixing part 33b and a normal coincidence processing part 33c to map the texture on the triangular polygon mesh for each patch unit and mix colors for ensuring the continuity of the texture to the texture of the adjacent patch.

The crimp generating part 34 includes a vertex displacing part 34a and a crimp applied polygon mesh forming part 34b to displace positions of the vertexes respectively in accordance with the density gradations of the texture data corresponding to the vertexes of the triangular polygon mesh and generate polygon data to which the crimps are applied.

As for the displacement of the positions of the vertexes of the triangular polygon mesh, the displacement is changed by applying a rate of reduction of displacement depending on a drawing gradient of a metal mold to prevent an undercut from being formed during a mold drawing process. To the data processing part 13, a plurality of change expressions for determining the rate of reduction of displacement are previously set. Thus, any of the change expressions can be selected by an operation of the operation input part 22 with the property of a molding material or a product configuration taken into consideration.

In the operation memory 35, processed data in the parts of the data processing part 13 are respectively temporarily stored.

In the processed data storing part 14, the triangular polygon meshes of all the patches which are formed in the polygon mesh forming part 30 are initially stored, read and restored for each of the patch units in accordance with processes in the data processing part 13. Data of two patches to be processed at maximum is temporarily stored in the operation memory 35. Namely, the triangular polygon meshes of the adjacent patches sequences of the vertexes of which are allowed to correspond to each other by the polygon mesh integrating part 31 are erased from the operation memory 35 every time a coincidence process is finished and replaced by new adjacent triangular polygon meshes. Further, the triangular polygon mesh mapped in the texture combining part 33 is also stored in the processed data storing part 14 every time a process for each of the patch units is finished and erased from the operation memory 35.

The data processing part 13 stores the polygon data to which the crimps are applied in the polygon data storing part 19 for each of the patch units.

On the monitor 23, progress states of the processes including images can be respectively displayed.

Now, a detail of processes in the surface treatment data forming device 10 will be described below.

Figure 2:
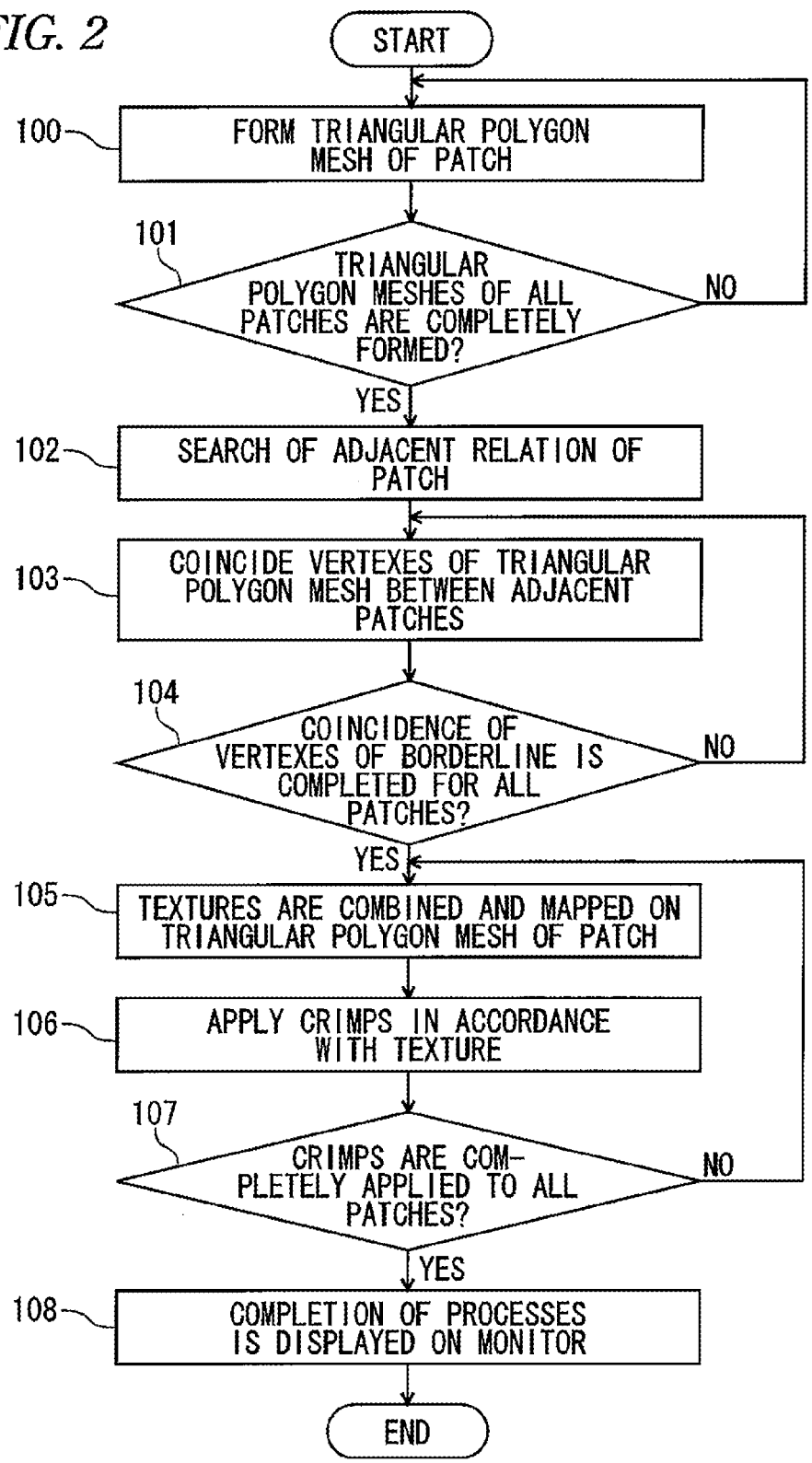
FIG. 2 is a main flowchart showing a flow of processes in the surface treatment data forming device.

FIG. 2 is a main flowchart showing a flow of the processes.

When the patch information of the surface configuration data of the product, the texture data of the crimps, angle information of the mold opening direction and a below-described space upper limit value b of the triangular polygon mesh are inputted to the data input part 11 by the operation of the operation input part 22, the data is respectively stored in the input data storing part 12 to start a process. The change expression for determining the rate of reduction of displacement is selected by the operation input part 22 together with the input of the data.

Initially, in step 100, the polygon mesh forming part 30 of the data processing part 13 reads information of the patch from the input data storing part 12 to form the triangular polygon mesh Qc.

In step 101, the polygon mesh forming part checks whether or not the triangular polygon meshes are formed for all the patches.

When the patches are left for which the polygon meshes Qc are not yet formed (step 101: No), the polygon mesh forming part returns to the step 100. When the triangular polygon meshes of all the patches are completely formed (step 101: Yes), the procedure advances to step 102.

In the step 102, the adjacent relation search part 31a of the polygon mesh integrating part 31 searches an adjacent relation as to whether or not the borderline of the patch is overlapped on the borderline of other patch for each of the patches to specify the adjacent patches to each other.

In next step 103, the configuration continuity processing part 32b of the polygon mesh integrating part 31 allows the vertexes on the borderlines of the patches having the adjacent relation to correspond to each other. Since sequences of vertexes on the borderlines are desired to be shared as the same positions between the patches, the vertexes on the borderlines are moved or newly formed to allow the vertexes to coincide with each other.

In step 104, whether or not a vertex coincidence process is completed for all the patches is checked.

When the patch remains in which the vertex coincidence process is not yet completed (step 104: No), the procedure returns to the step 103. When the vertex coincidence process is completed for all the patches (step 104: Yes), the procedure advance to step 105.

In the step 105, the texture combining part 33 maps the texture on the triangular polygon mesh Qc of the patch.

In step 106, the crimp generating part 34 moves the vertexes of the triangular polygon mesh Qc respectively by a displacement mapping in accordance with the texture data and the processing tool data to store the polygon data to which the crimps are applied in the polygon data storing part 19.

The steps 105 and 106 are successively carried out for one patch.

In step 107, is checked whether or not the crimp configurations are applied and stored in the polygon data storing part 19 for all the patches.

When the application of the crimp configurations is not yet finished for all the patches (step 107: No), the procedure returns to the step 105. When the application of the crimp configurations is finished (step 107: Yes), the procedure advances to step 108.

In the step 108, the completion of the processes is displayed on the monitor 23 to finish the processes. The data stored in the processed data storing part 14 is erased.

After that, the data output part 20 reads the polygon data to which the crimps are applied from the polygon data storing part 19 by the operation of the operation input part 22 so that the data may be outputted to a processing device as the processed data.

Figure 3:
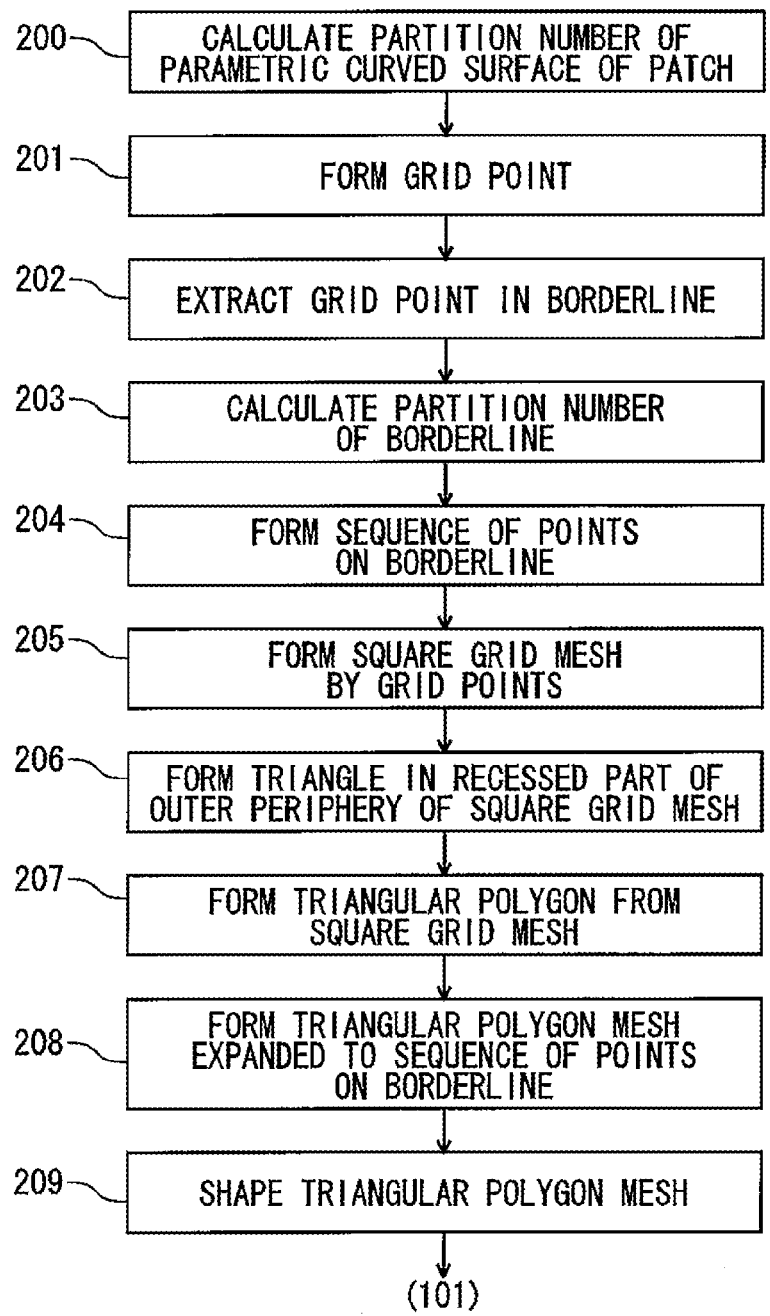
FIG. 3 is a flowchart showing a detail of formation of a triangular polygon mesh.

FIG. 3 is a flowchart showing a detail of formation of the triangular polygon mesh Qc carried out by the polygon mesh forming part 30 in the step 100.

Figure 4A:
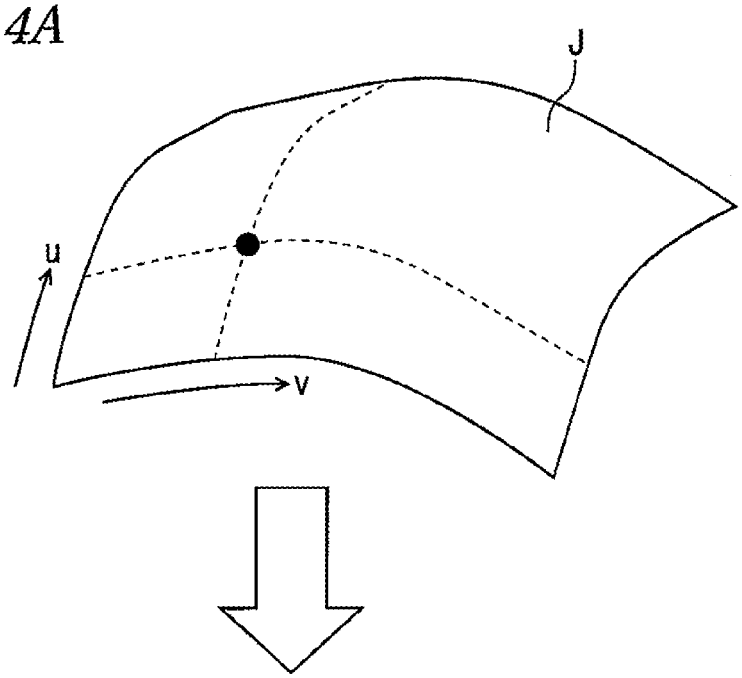
FIG. 4 is a conceptual diagram showing a dividing method in a patch.
Figure 4B:
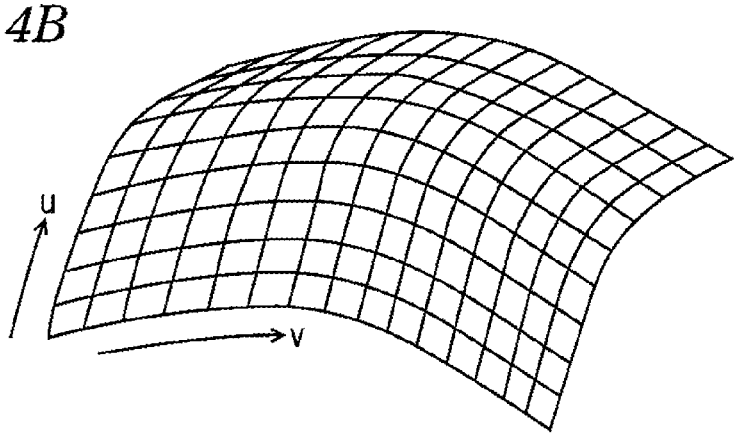

In step 200, partition numbers of the parameters u and v are calculated which divide the free curved surface (a parametric curved surface) J of the selected patch as shown in FIG. 4(a) so that a space of a grid is the space upper limit value b or smaller. For instance, a parameter space (a maximum value−a minimum value) of u of the patch is divided by a certain integer m to obtain a parameter space c. The patch is divided by using c to compare a result with the space upper limit value b. When the result is larger than b, m is increased. This process is repeated until all grid spaces are smaller than the space upper limit value b. The same process is carried out for the parameter v FIG. 4(b) shows partition lines on the free curved surface.

Figure 5:
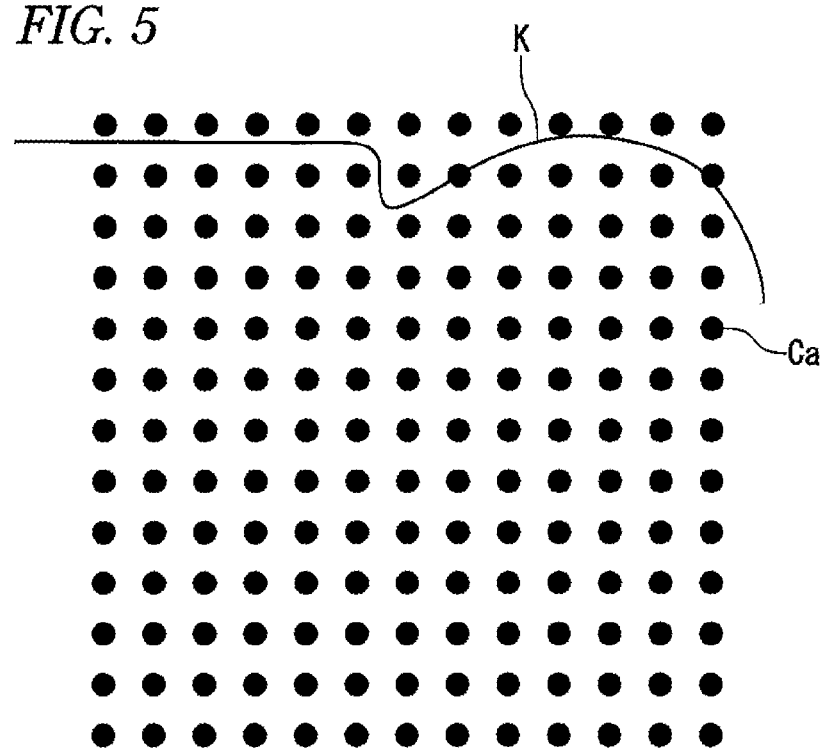
FIG. 5 is a diagram showing grid points and a borderline.

In step 201, parameter values of grid points are calculated by using the partition numbers of u and v respectively calculated as described above to generate points on the free curved surface as shown in FIG. 5. The generated points are referred to grid points Ca, hereinafter. FIG. 5 is an enlarged view along a u-v plane and an iso-parametric curved line is omitted for simplification.

In step 202, the grid points Ca for forming the polygon mesh are extracted.

Figure 6:
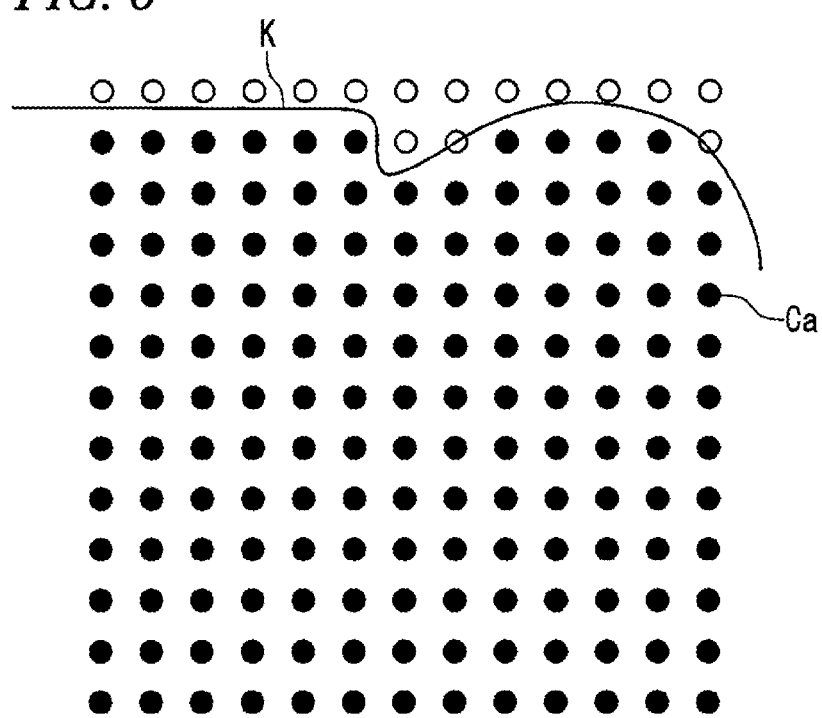
FIG. 6 is an explanatory view showing an extracting method of the grid points forming the polygon mesh.

Specifically, as shown by voids in FIG. 6, the grid points Ca which include the borderline K of the patch and are located outside the borderline are deleted. Further, are also deleted the grid points which are located inside the borderline K, however, distances from the borderline of which are smaller than $1/100$ times as long as the grid space. The grid space may be the space upper limit value b or an actually divided grid space.

The borderline K includes the trimming line and is shown by a B-spline curved line. The configuration of the borderline K is arbitrary for each of the patches.

The grid points Ca the distances from the borderline K of which are shorter than a prescribed distance are eliminated to avoid a polygon formed by using below-described points on the borderline K from being extremely small.

Figure 7:
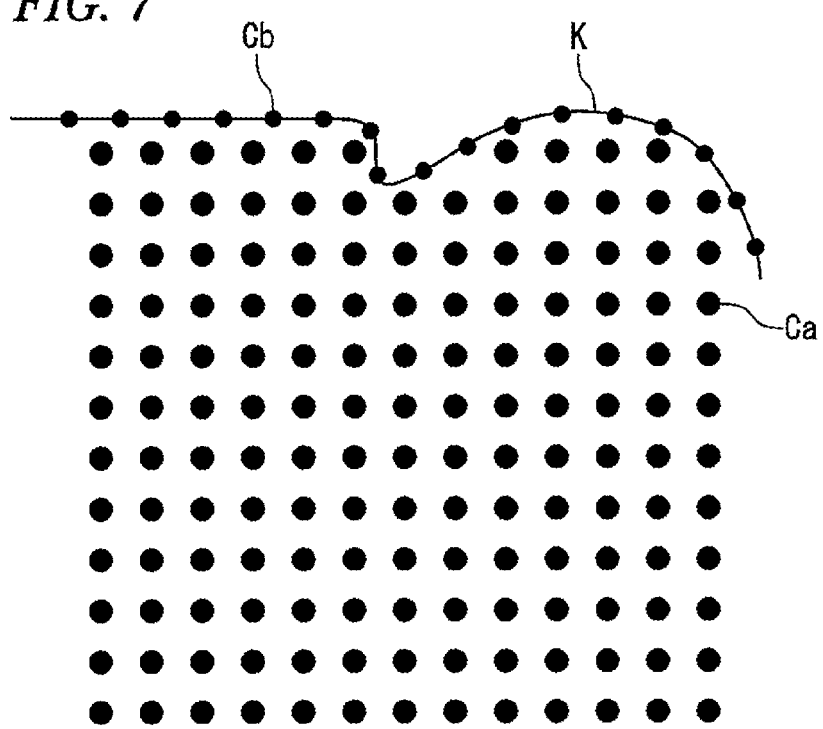
FIG. 7 is an explanatory view showing a forming method of a sequence of points on the borderline.

In step 203, a partition number is calculated which divides the borderline K to obtain spaces having the space upper limit value b or smaller. In step 204, as shown in FIG. 7, a sequence of points Cb is formed on the borderline K by using the partition number. Individual points of the sequence of points are also designated by Cb as described below.

The partition number may be set to a value by which an entire circumference is equally divided as in the case of the grid points Ca. As for the division of the grid points Ca and the sequence of points Cb, both the grid points Ca and the sequence of points Cb may be divided by the space upper limit value b, and then, only the last part exceeding the space upper limit value b may be divided into two. Thus, the grid points and the sequence of points may respectively have equalized spaces within a prescribed range.

Figure 8:
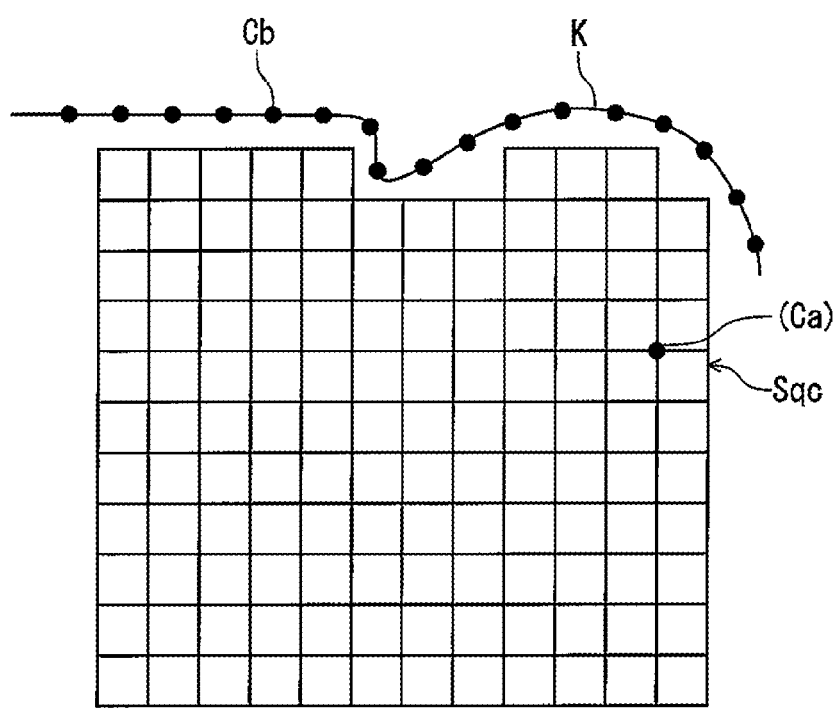
FIG. 8 is a diagram showing a square grid mesh formed by the grid points.

In step 205, a square grid mesh Sqc is formed as shown in FIG. 8 by using the grid points Ca extracted in the previous step 202. Intersection points respectively correspond to the grid points Ca, however, a display of black circles of the grid points Ca is omitted.

Figure 9:
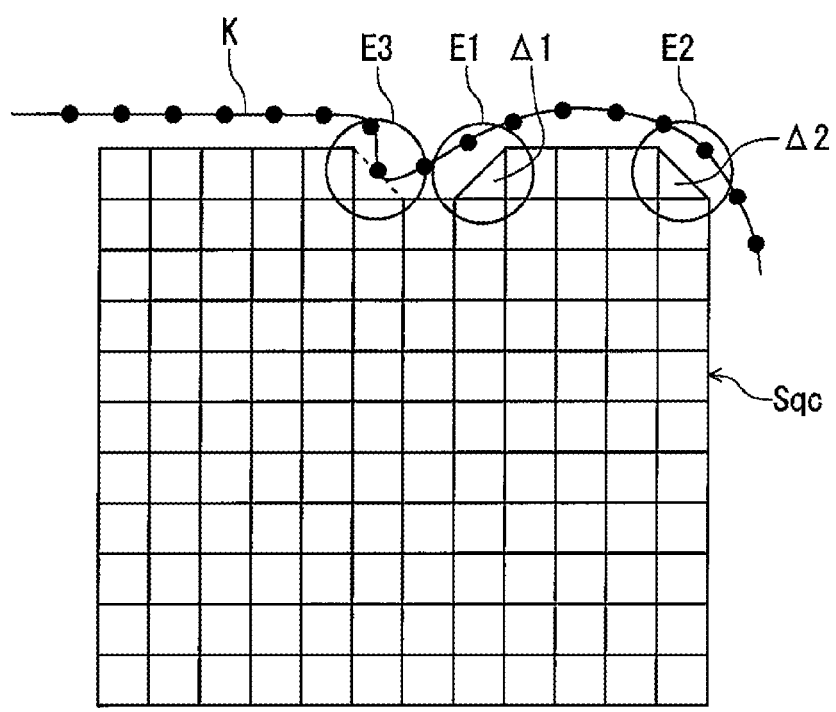
FIG. 9 is an explanatory view showing a forming method of triangular forms in recessed parts of an outer periphery of the square grid mesh.

In step 206, when an outer periphery of the square grid mesh Sqc is formed in the shape of stairs to have recessed parts, as shown by parts E1 and E2 in FIG. 9, two grid points of the outer periphery which respectively sandwich interior angles of the recessed parts are connected together by straight lines to form triangles Δ1 and Δ2. However, as shown by a broken line of a part E3, when a straight line connecting two grid points together traverses the borderline K, a triangle is not formed.

Figure 10:
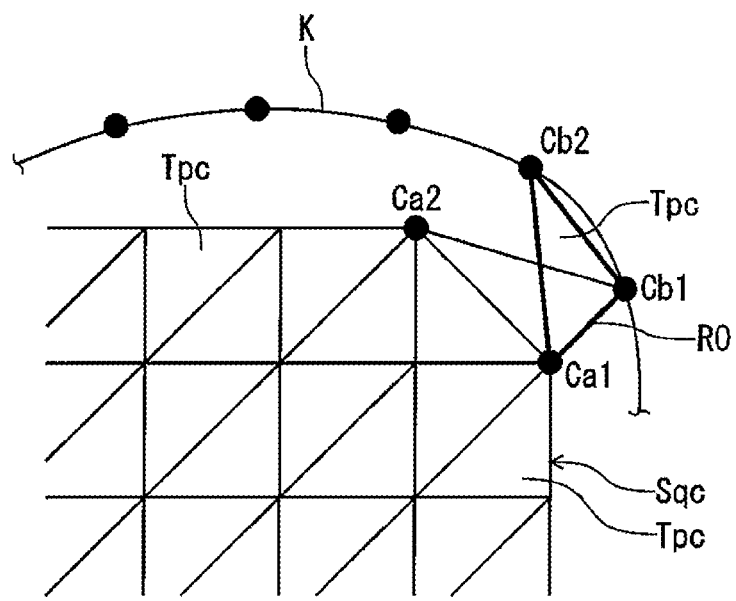
FIG. 10 is a diagram showing a forming method of a triangular polygon by the square grid mesh and the sequence of points on the borderline.

In step 207, as shown in FIG. 10, the grid points located at a pair of diagonal positions in each of the grids of the square grid mesh Sqc are connected together to form a triangular polygon Tpc.

Subsequently, in step 208, the triangular polygon is also formed between the grid point Ca located in the outer periphery of the square grid mesh Sqc and the sequence of points Cb on the borderline K.

Here, as shown in FIG. 10, one Ca1 of the grid points located on the outer periphery is initially selected and connected to the point Cb1 on the borderline K which is nearest thereto. This connecting straight line R0 is set as one side to calculate a triangle ΔCa1-Cb1-Ca2 by further including an adjacent grid point Ca2 located in the outer periphery of the square grid mesh Sqc, and a triangle ΔCa1-Cb1-Cb2 by further including an adjacent point Cb2 on the borderline K. One of the two triangles nearer to a regular triangle is used as the triangular polygon Tpc.

As for whether or not the triangle is near to the regular triangle, it may be decided as described below. As a difference between a maximum interior angle and a minimum interior angle is nearer to 0 (zero), the triangle is the nearer to the regular triangle, or as the ratio of the length of the longest side to the length of the shortest side is nearer to 1, the triangle is the nearer to the regular triangle.

Then, to the grid points (for instance, Ca2) on the outer periphery of the square grid mesh Sqc which are sequentially adjacent to the selected grid point Ca1, the above-described processes are repeated. As an adjacent direction, a counterclockwise direction or a clockwise direction may be previously determined.

Figure 11:
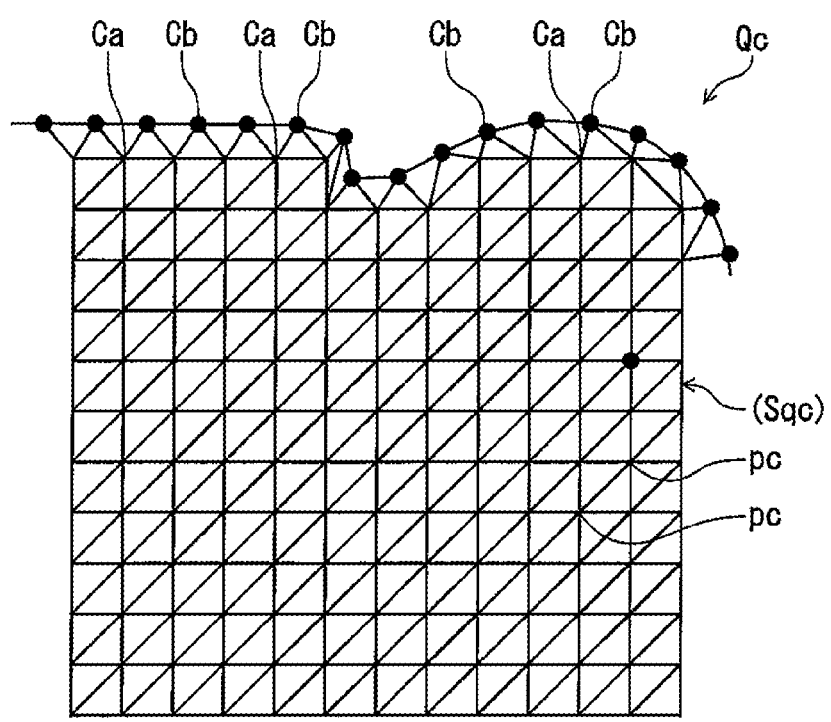
FIG. 11 is a diagram showing a triangular polygon mesh formed on the patch.

According to the above-described processes, as shown in FIG. 11, the triangular polygon mesh Qc which is expanded from the outer periphery of the square grid mesh Sqc to the sequence of points Cb on the borderline K is formed on the free curved surface J of the patch.

In step 209, the triangular polygon mesh Qc is shaped by an edge swapping process. In the step 208, the triangular polygon mesh Qc is formed by the process that the triangle near to the regular triangle good in its form is selected for each step. However, when an entire part of the formed triangular polygon mesh is seen, a better triangle may be sometimes formed by the edge swapping process.

Figure 12:
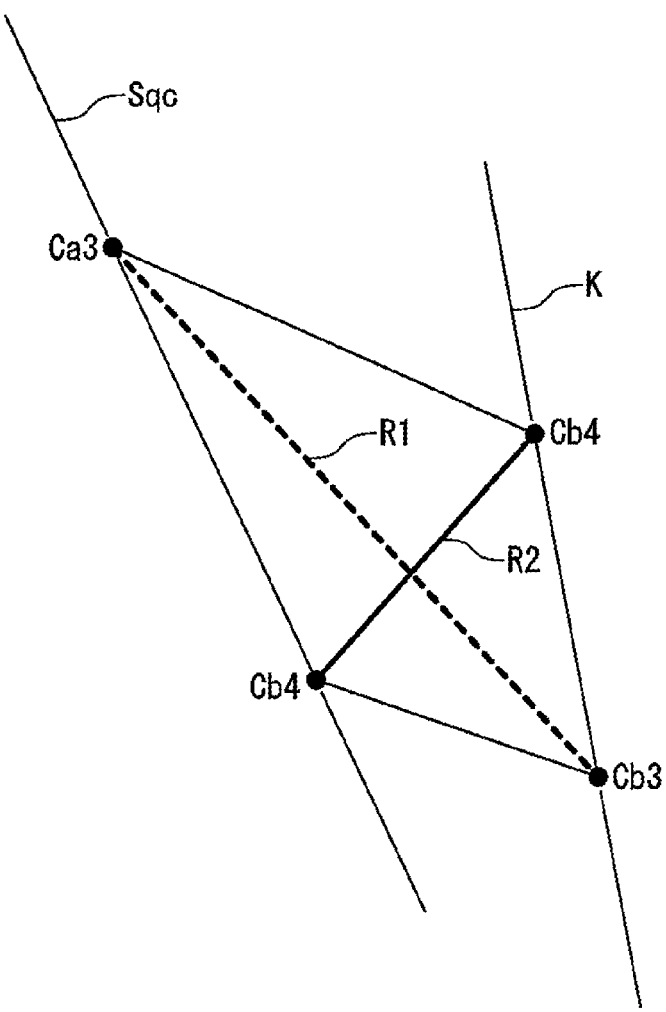
FIG. 12 is an explanatory view showing a shaping method of the triangular polygon mesh.

Here, to one edge line R1 shown by a broken line in FIG. 12 which connects a grid point Ca3 on the outer periphery of the square grid mesh Sqc to a point Cb3 on the borderline to have triangular polygons in both sides thereof, an edge line R2 is calculated, as shown by a thick full line, which connects a point Cb4 on the borderline forming one triangular polygons to a grid point Ca4 on the outer periphery forming the other triangular polygons. Then, two triangles (triangles after the edge swapping process) are obtained which are formed in both the sides of the new edge line R2.

As shown in FIG. 12, when two triangles Δ Ca4-Cb4-Ca3 and ΔCa4-Cb4-Cb3 after the edge swapping process are nearer to the regular triangles than two triangles ΔCa3-Cb3-Cb4 and ΔCa3-Cb3-Ca4 before the edge swapping process, the edge line R1 as the broken line is eliminated to use the triangles ΔCa4-Cb4-Ca3 and ΔCa4-Cb4-Cb3 after the edge swapping process as the triangular polygons by a replacement.

To the grid points on the outer periphery of the square grid mesh Sqc which are sequentially adjacent, the above-described processes are repeated, so that the triangular polygon mesh Qc of the patch is shaped.

Data of the triangular polygon mesh Qc of each patch is stored in the processed data storing part 14 every time the data is formed as described above.

In below-described processes respectively, when the patch is merely mentioned, the patch indicates the triangular polygon mesh Qc of the patch as long as there is no special mention.

Figure 13:
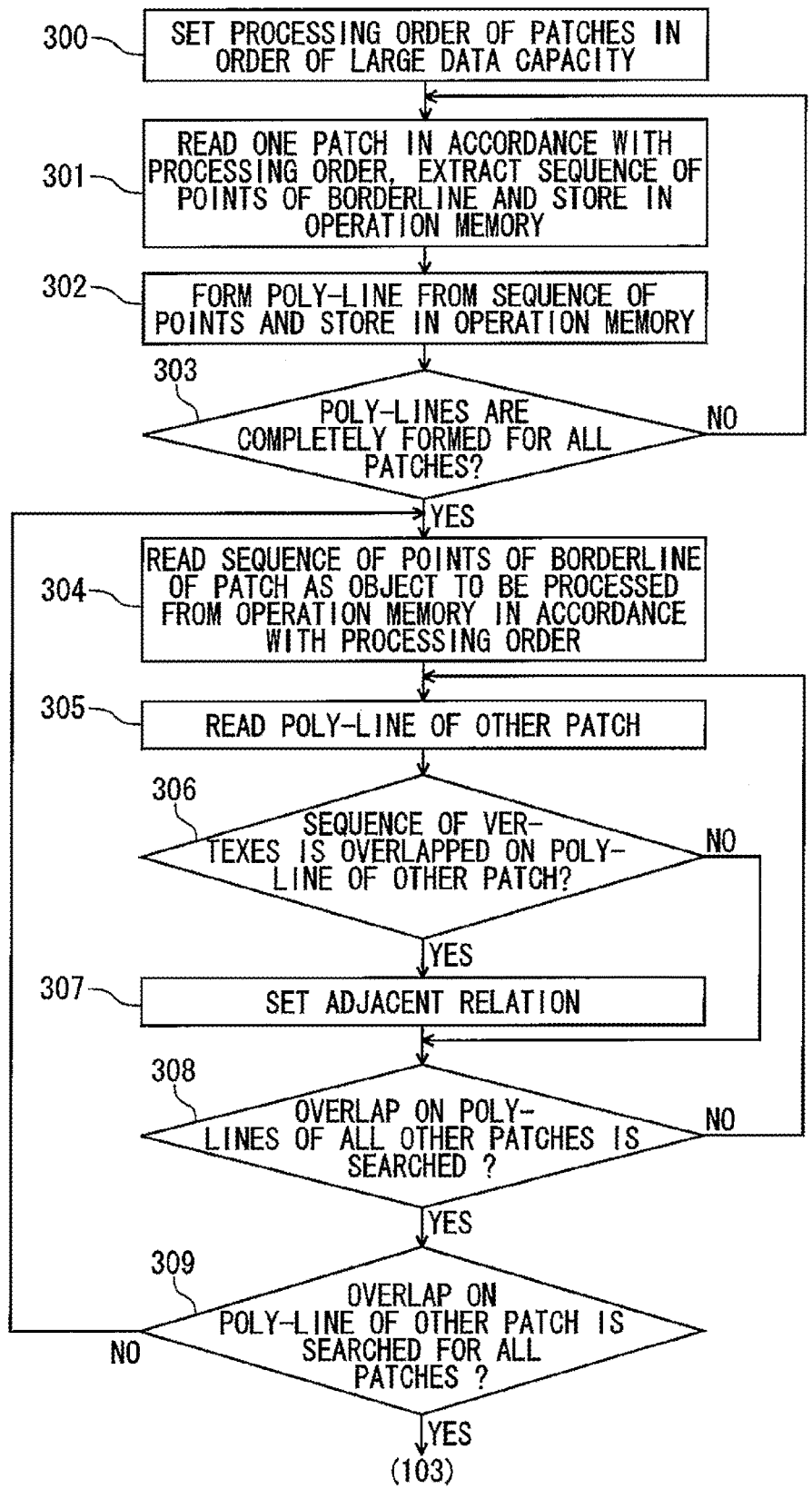
FIG. 13 is a flowchart showing a detail of a search for an adjacent relation of the patches.

FIG. 13 is a flowchart showing a detail of a search for an adjacent relation of the patches carried out by the adjacent relation search part 31a in the step 102.

Initially, in step 300, data capacities of the triangular polygon meshes Qc of all the patches are examined to set a processing order of the patches in order of large data capacity.

When the plurality of patches are individually compared to search the adjacent relation of the patches, the number of times of inputs and outputs of the previously inputted patches is smaller than the number of times of inputs and outputs of the afterward inputted patches. According, the order is determined to reduce the number of times of inputs and outputs of the patches having the large data capacities is reduced as many as possible and increase a processing speed.

In step 301, the data of the triangular polygon mesh Qc of one patch is read to the operation memory 35 from the processed data storing part 14 in order to large data capacity to extract the sequence of vertexes on the borderline. The extracted sequence of vertexes (data thereof) is stored in the operation memory 35 as a global coordinate file. After that, the data of the triangular polygon mesh Qc is erased from the operation memory 35.

In step 302, a poly-line is formed by using the sequence of vertexes of the operation memory 35. The poly-line is stored in the operation memory 35. Since the poly-lines in the patches are respectively small in their quantity of data, the poly-lines are accumulated in the operation memory 35.

In step 303, whether or not the poly-lines are formed for all the patches is checked.

When the patch exists for which the poly-line is not formed (step 303: No), the procedure returns to the step 301. When the poly-lines of all the patches are completely formed (step 303: Yes), the procedure advances to step 304.

In the step 304, the sequence of vertexes on the borderline K of the patch WA as an object to be processed is read from the operation memory (the global coordinate file) in order of large data capacity. In step 305, the poly-line of other patch W is read.

Then, in step 306, is searched whether or not the sequence of vertexes of the patch WA is overlapped on the poly-line of other patch W in question.

When the sequence of vertexes of the patch WA is overlapped on the poly-line of other patch W (step 306: Yes), the procedure advances to step 307 to set an adjacent relation that other patch W in question is adjacent to the patch WA as the object to be processed and store adjacent information in the operation memory 35. Then, the procedure advances to step 308.

When the sequence of vertexes is not overlapped on the poly-line of other patch W (step 306: No), the procedure advances to the step 308.

In the step 308, is checked whether or not an overlap of the sequence of vertexes of the patch WA as the object to be processed on the poly-line is searched for all other patches W.

When other patch W remains for which the overlap of the sequence of vertexes of the patch WA on the poly-line is not searched (step 308: No), the procedure returns to the step 305 to read the poly-line of the remaining other patch W and repeat a search process.

When the overlap of the above-described sequence of vertexes on the poly-line is completely searched for all other patches W (step: Yes), the adjacent information of the one patch WA as the object to be processed is obtained.

After that, in step 309, is checked whether or not the adjacent relation is searched for all the patches respectively set as objects to be processed.

When the patch still remains which is not set as the object to be processed (step 309: No), the procedure returns to the step 304. When all the patches are set as the objects to be processed to finish a search of the adjacent relation (step 309: Yes), the procedure advances to the step 103.

Figure 14:
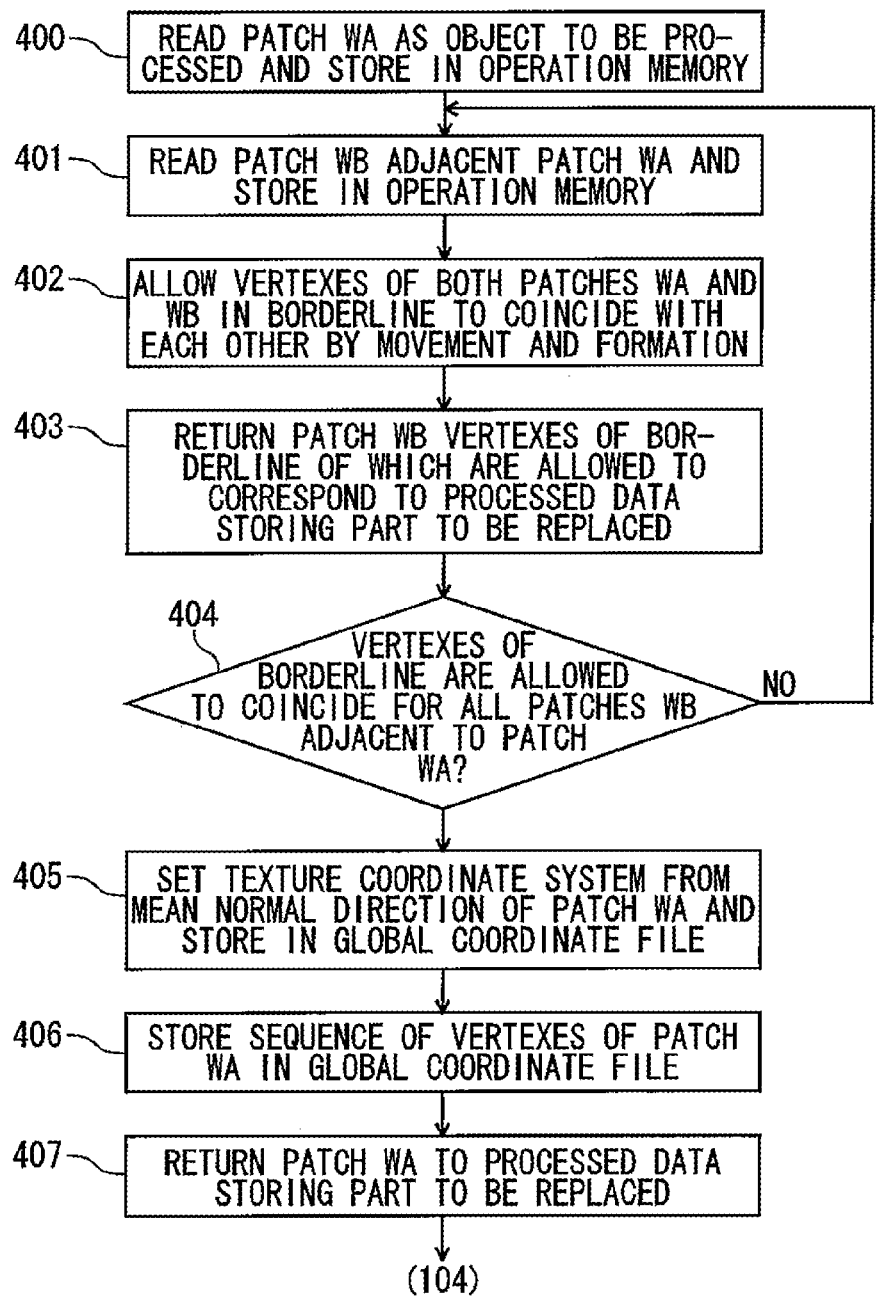
FIG. 14 is a flowchart showing a detail of a vertex coincidence process on the borderline.

FIG. 14 is a flowchart showing a detail of the vertex coincidence process carried out by the configuration continuity processing part 31b in the step 103. FIG. 15 to FIG. 18 are explanatory views showing a progress of the vertex coincidence process.

In step 400, initially, the data of the triangular polygon mesh Qc of the patch WA as the object to be processed is read to the operation memory 35 from the processed data storing part 14. Then, in step 401, the data of the triangular polygon mesh Qc of the patch WB having the adjacent relation to the patch WA is also read to the operation memory 35 from the processed data storing part 14. The patch WA and the patch WB are read in order of large data capacity as described above.

In step 402, the vertexes on the boundary of the two patches WA and WB are moved or formed to allow them to correspond to each other.

Here, initially, the sequences of vertexes mounted on the borderlines of the patches WA and WB are searched. In the above-described explanation, as a symbol showing the borderline, K is used. However, in place of K, the borderline of the patch WA is designated by BOA and the borderline of the patch WB is designated by BOB herein. The borderline BOA of the patch WA and the borderline of BOB of the patch WB originally have a relation that the borderlines are overlapped on each other. However, for the convenience of explanation, FIG. 15 to FIG. 18 illustrate that the borderlines are spaced apart.

In the illustrated example, the vertexes Pa1 to Pa5 form the sequence of vertexes PA on the borderline BOA of the patch WA. The vertexes Pb1 to Pb7 form the sequence of vertexes PB on the borderline BOB of the patch WB. However, both the sequences of vertexes are not located on the same positions.

Further, as shown in the drawing, for instance, in an angular part of the patch WB, when a vertex Pbz in a front side adjacent to a starting point (a vertex Pb1) of the sequence of vertexes PB is not mounted on a common line to the borderline BOA of the patch WA, the borderline which connects the vertex Pbz to the vertex Pb1 of the starting point in the patch WB does not correspond to the borderline BOA of the patch WA. In such a case, a vertex Pa1 of the patch WA is a vertex on the borderline BOA, however, is not on the common borderline to the patch WB. Accordingly, it is not suitable to allow the vertex Pa1 to correspond to the vertex Pbz on the borderline of the patch WB spaced from the borderline BOA.

Thus, the vertexes the positions of which are al lowed to correspond to each other are limited to the vertexes respectively mounted on common parts of the borderlines BOA and BOB of the patch WA and the patch WB.

Figures 15A, 15B, 15C:
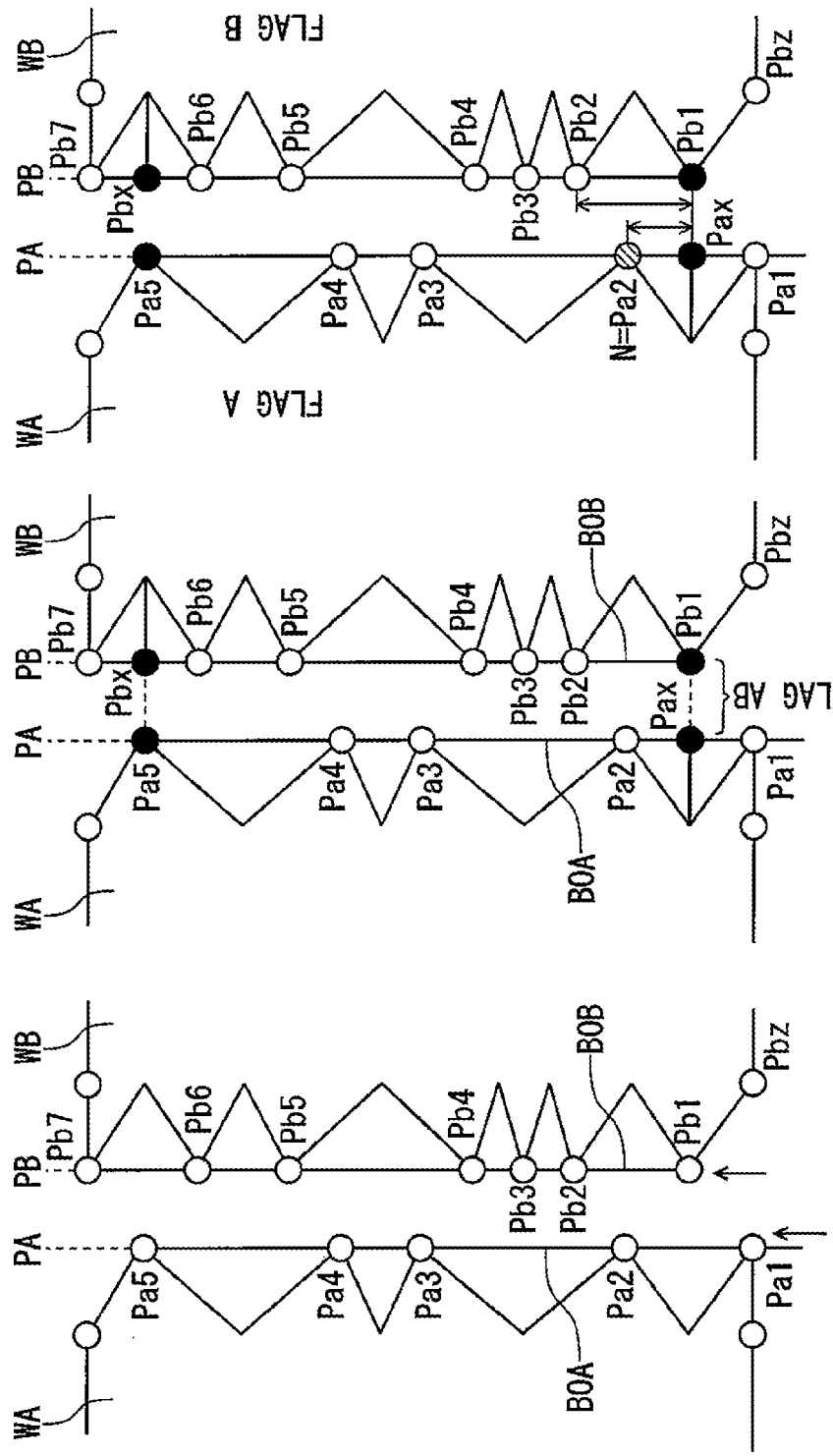
FIG. 15 is an explanatory view showing a progress of the vertex coincidence process.

Accordingly, as shown by arrow marks in FIG. 15(a), search paths are set in such a way that in the patch WA, the sequence of vertexes PA is traced counterclockwise, and in the patch PB, the sequence of vertexes PB is traced clockwise. The vertexes are searched along the search paths, and when the starting point (the vertex Pb1) of the sequence of vertexes PB is located on the borderline BOA of the patch WA, the starting point is set as an end of the sequence of vertexes located on the common borderline. On the contrary, when the starting point of the sequence of vertexes Pb is not located on the borderline BOA of the patch WA, namely, not located on the common borderline, a starting point of the sequence of vertexes PA of the patch WA is set as an end of the sequence of vertexes located on the common borderline.

The above-described matter is applied to endpoints of the sequences of vertexes of the patch WA and the patch WB.

Thus, initially to allow the ends of the sequences of vertexes located on the common borderline to coincide with each other, as shown in FIG. 15(b), on the borderline BOA of the patch WA, a vertex Pax is formed at the same position as that of the starting point (Pb1) of the sequence of vertexes PB of the patch WB and set as a starting point position on the common borderline. Similarly, on the borderline BOB of the patch WB, a vertex Pbx is formed at the same position as that of an end point (a vertex Pa5) of the sequence of vertexes PA of the patch WA and set as an end point position on the common borderline. The vertexes the positions of which are allowed to correspond to each other are shown by black circles.

Both the vertexes (Pax, Pb1) of the starting point positions set to the same positions in the patch WA and the patch WB are set as object or target points N and flags of the target points are respectively designated by AB. Namely, the flag AB shows the vertexes the positions of which correspond to each other.

Between the vertex Pax formed on the borderline BOA and other vertex of a triangle which has one side formed by vertexes Pa1 and Pa2 before and behind the vertex Pax, an edge is formed to divide the triangle into two triangular polygons so that a square is not formed.

Then, as shown in FIG. 15(c), in the sequence of vertexes PA of the patch WA and the sequence of vertexes PB of the patches WB, distances from the vertexes respectively determined as the flags AB to next vertexes are calculated to set the vertex having a shorter distance as a next object or target point N. A flag of the patch including the target point N is designated by A. A flag of the other patch is designated by B. Further, next vertexes are searched along the search paths to determine whether the vertex is moved or formed depending on in which of the patch of the flag A or the flag B the next vertex nearest to the target point N is located. In other words, it is decided in which patch WA or WB the vertex secondly nearest to the vertexes set as the flags AB is located to determine whether the vertex is moved or formed.

Namely, when the vertex nearest to the target point N exists in the patch of the flag A, a new vertex is formed at the same position as that of the target point N of the flag A on the borderline of the patch of the flag B. That is, when the vertexes near the vertex of the flag AB are continuously arranged in the same patch side, the new vertex is formed in the patch of the flag B having no target point N.

On the other hand, when the vertex near the target point N exists in the patch of the flag B, the vertex near the target point and the vertex of the target point N are respectively moved to an intermediate position of the vertexes. Namely, when the two vertexes near the vertexes of the flags AB are located in mutually different patches, the two vertexes are moved to the intermediate position of them.

When the vertexes near the target point N are located in positions of the patch A and the patch B which are spaced by an equal distance from the target point N, a new vertex is formed at the same position as that of the target point N of the flag A on the borderline of the patch of the flag B as in the case that the target point N and the vertex near the target point N exist on the patch of the flag A.

In the example shown in FIG. 15, since a vertex Pa2 of the patch WA is nearer to the vertexes of the flags AB than a vertex Pb2 of the patch WB, the vertex Pa2 is set as the target point N, the flag of the patch WA is designated by A and the flag of the patch WB is designated by B.

Figure 16D:
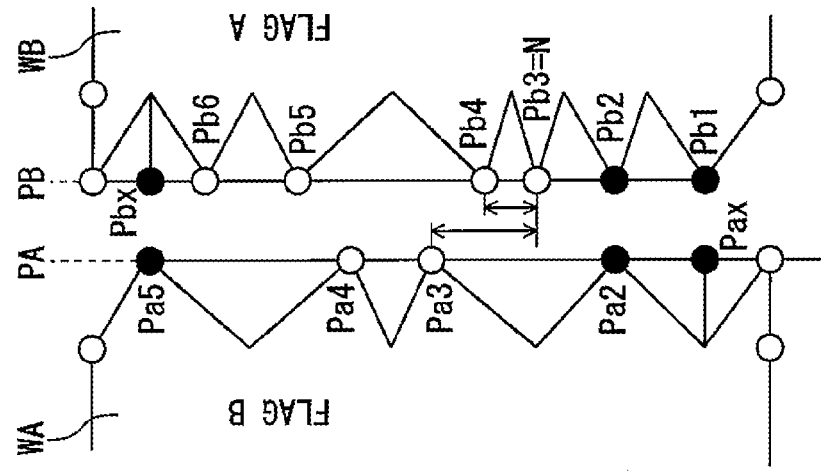
FIG. 16 is an explanatory view showing a progress of the vertex coincidence process.
Figure 16E:
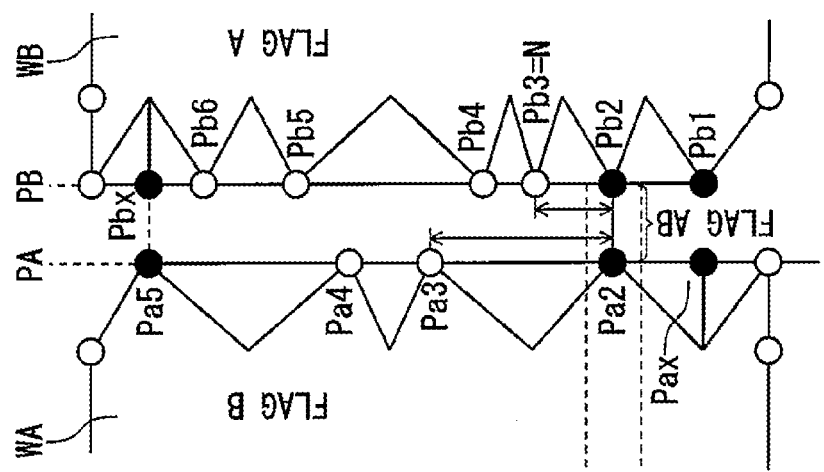

Then, as shown in FIG. 16(d), a next vertex near the vertex Pa2 set as the target point N in the patch WA of the flag A is a vertex Pb2 of the patch of the flag B. Namely, since two vertexes near the vertexes of the flags AB are located in the mutually different patches, as shown in FIG. 16(e), the vertex Pa2 of the target point N and the vertex Pb2 of the patch of the flag B near the target point N are moved to an intermediate position of both the vertexes to designate flags of the vertexes Pa2 and Pb2 respectively by AB.

Then, distances to next vertexes from the vertexes Pa2 and Pb2 designated by the flags AB are calculated. Since a vertex Pb3 is nearer than a vertex Pa3, the vertex Pb3 is set as a new target point N and the flag of the patch WB is changed to A and the flag of the patch WA is changed to B.

Figure 16F:
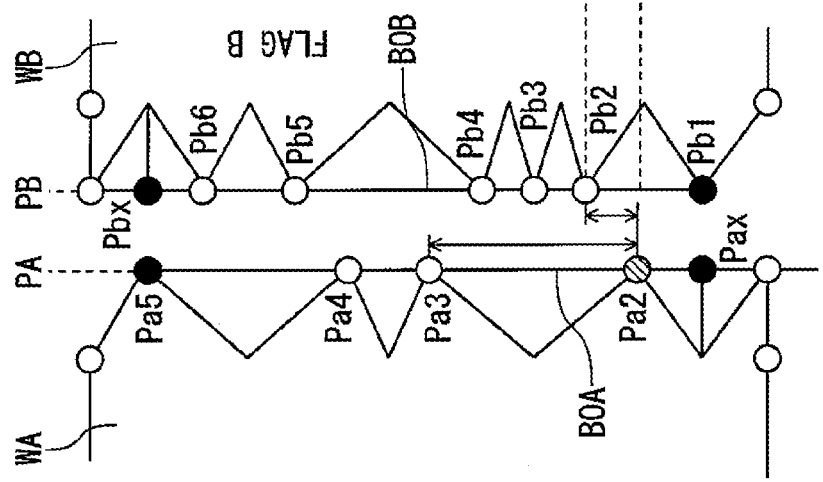

Subsequently, as shown in FIG. 16(f), a next vertex near the vertex Pb3 of the target point N is a vertex Pb4 in the patch WB of the flag A. Namely, since the two vertexes near the vertexes Pa2 and Pb2 of the flags AB are located in the same patch, as shown in FIG. 17(g), a vertex Pay is formed at the same position as that of the vertex Pb3 on the borderline BOA of the patch WA of the flag B to designate the vertexes Pay and Pb3 by the flags AB.

Also, in this case, between the vertex Pay formed on the borderline BOA and other vertex of a triangle having one side formed by the vertexes Pa2 and Pa3 before and behind the vertex Pay, an edge is formed to divide the triangle into two triangular polygons When distances to next vertexes from the vertexes of the flags AB in the patches A and B are equal, positions of the vertexes may be directly determined to set the vertexes to next vertexes of the flags AB.

Figure 18K:
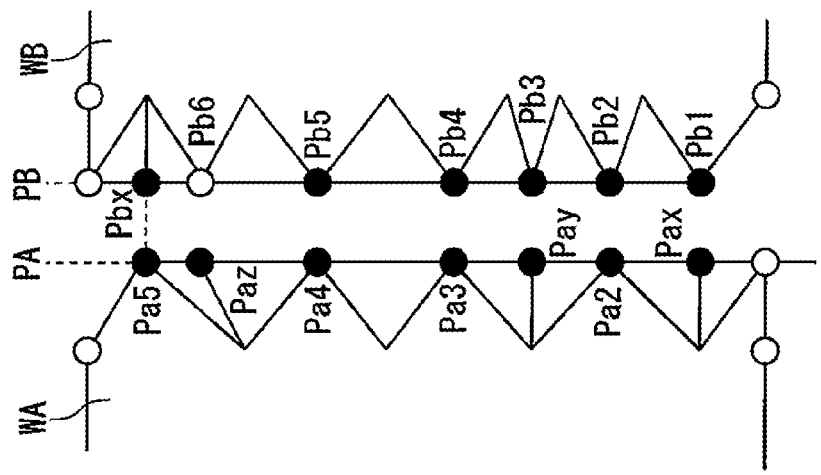
FIG. 18 is an explanatory view showing a progress of the vertex coincidence process.
Figure 18J:
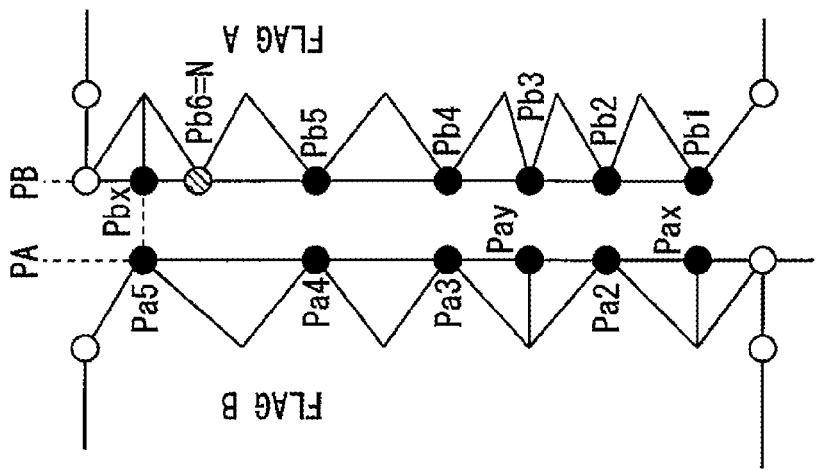

FIG. 17 and figures after FIG. 18(h) show progresses that the formation and movement of the vertexes are repeated along the search paths in accordance with the above-described method. Thus, finally, as shown in FIG. 18(k), two sequences of vertexes PA' and PB' are obtained the vertex positions of which are allowed to coincide with each other on the borderlines of the two patches WA and WB.

Now, returning to the flowchart in FIG. 14, in step 403, the triangular polygon mesh Qc of the adjacent patch WB the vertexes on the borderline of which are allowed to coincide with those of the patch WA as the object to be processed is returned to the processed data storing part 14 to be substituted and stored therein and erased from the operation memory 35.

In step 404, it is checked whether or not the vertexes on the borderlines are allowed to coincide with those of the patch WA for all the patches WB adjacent to the patch WA.

When the patch WB remains in which the vertex coincidence process is not yet carried out (step 404: No), the procedure returns to the step 401. When the vertexes are allowed to coincide for all the adjacent patches WB (step 404: Yes), the procedure advances to step 405.

In the step 405, a mean normal of an entire surface of the patch WA as the object to be processed is calculated to set a texture coordinate system from a mean normal direction and store the texture coordinate system in the global coordinate file of the operation memory 35. This is a preparation for the texture mapping. Specifically, for instance, an origin of a global coordinate system (X, Y, Z) is set to an origin of the texture coordinate system (s, t, u). A u-axis of the texture coordinate system is set as a mean normal direction of the patch.

After that, in step 406, the sequence of vertexes PA' of the borderline the vertexes of which are allowed to coincide in the patch WA is replaced and stored in the global coordinate file of the operation memory 35. In step 407, the triangular polygon mesh Qc of the patch WA is replaced and stored in the processed data storing part 14.

Thus, is finished the vertex coincidence process of the one patch WA with the adjacent patches WB on the borderlines. The triangular polygon mesh of the patch WA is excluded from objects of the subsequent vertex coincidence processes.

After that, in the step 104, it is checked whether or not the vertex coincidence process with the patch WA as the object to be processed and the adjacent patch WB is finished for all the patches W. When the patch remains which does not become an object to be processed, the procedure returns to the step 400 to repeat the above-described step processes for the patch secondly large in data capacity.

Now, a detail of an application of crimp configurations will be described below.

Figure 19:
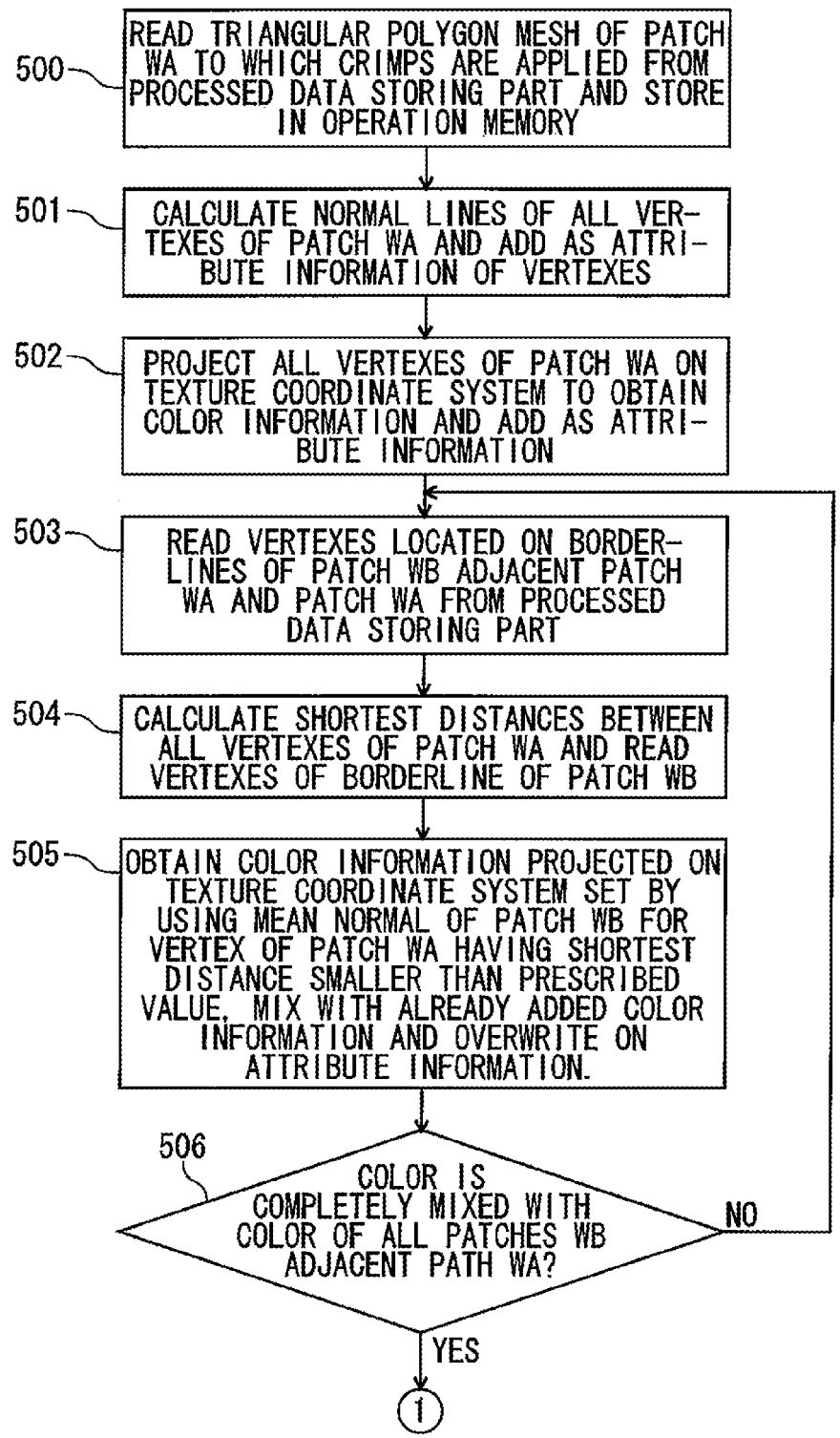
FIG. 19 is a flowchart showing a detail of texture mapping and displacement mapping.
Figure 20:
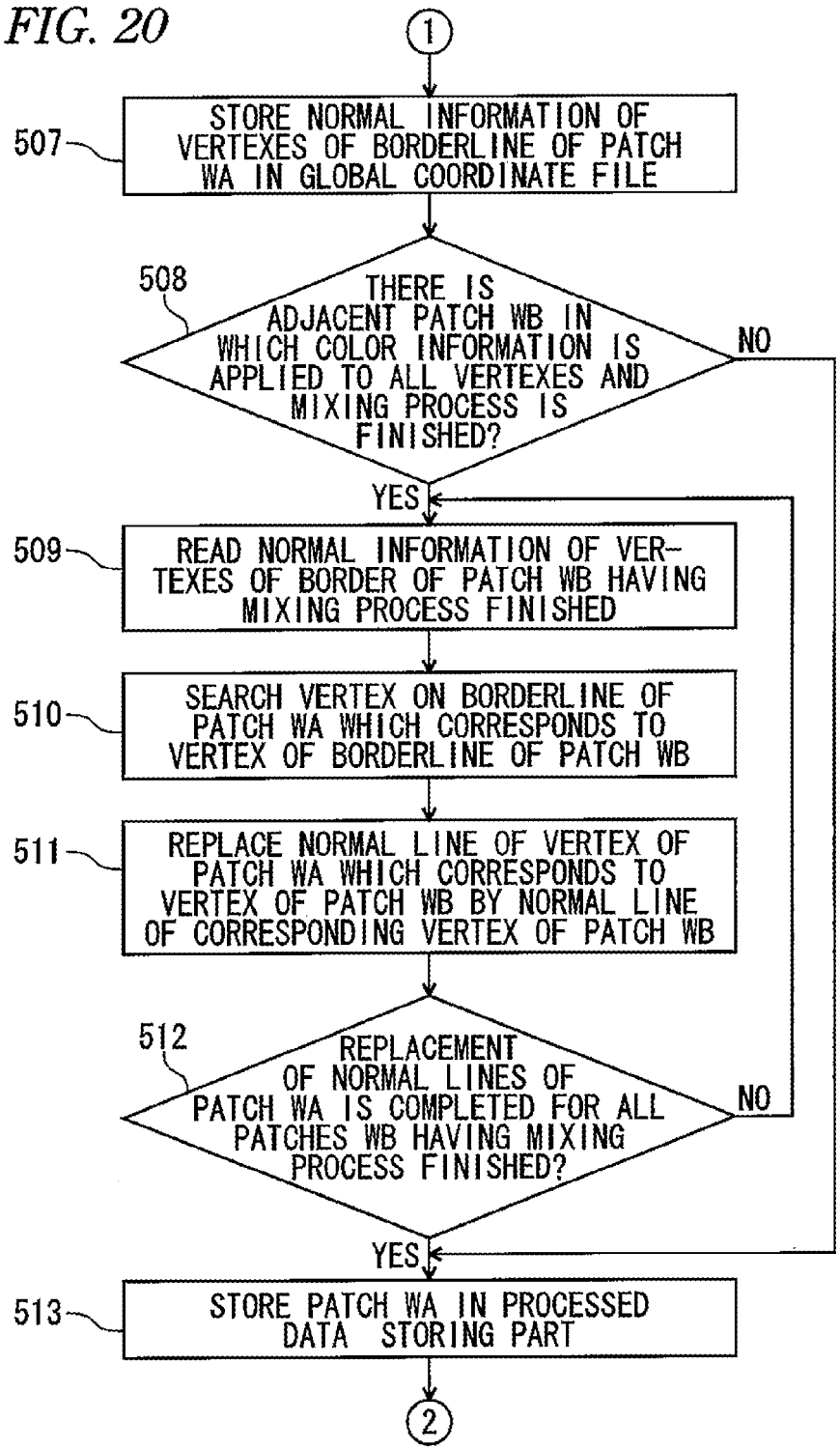
FIG. 20 is a flowchart showing a detail of texture mapping and displacement mapping.

FIG. 19 to FIG. 21 are flowcharts showing a detail of texture mapping and displacement mapping carried out by the texture combining part 33 and the crimp combining part 34 in the steps 105 and 106.

In step 500, the texture combining part 33 reads the polygon mesh Qc of the patch WA as the object to be processed to which the crimps are applied to the operation memory 35 from the processed data storing part 14. A reading order is set to an order of large data capacity that is set in the step 300.

In step 501, normal lines of all the vertexes included in the read triangular polygon mesh Qc of the patch WA are calculated and added as attribute information of the vertexes.

In next step 502, the mapping part 33a projects all the vertexes in the patch WA on the texture coordinate system of the patch WA which is set by using the mean normal in the step 405 to obtain color information and adds the color information as attribute information of the vertexes.

Figure 22B:
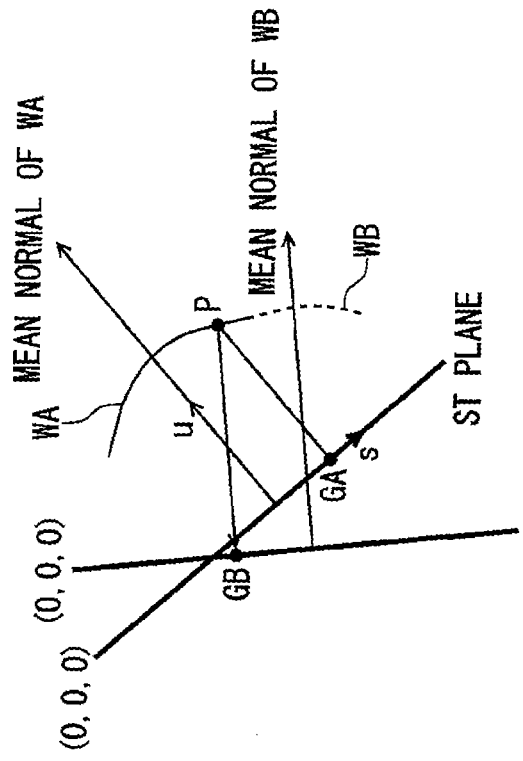
FIG. 22 is an explanatory view showing a mean normal of the patch and a projection direction of texture.
Figure 22A:
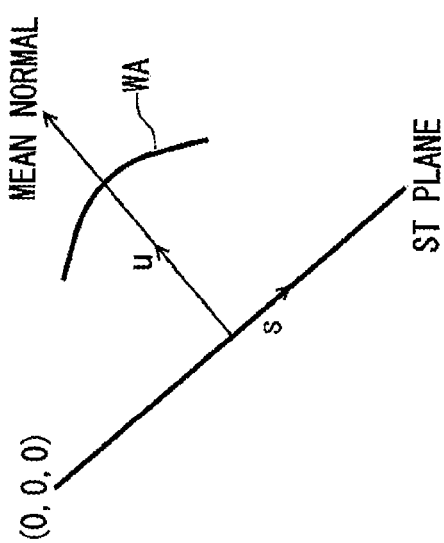

FIG. 22(a) shows the texture coordinate system of the patch WA. A projection direction of the texture is parallel to the mean normal.

Then, the texture mixing part 33b corrects the color information of the vertexes on the borderline of the patch so as to suppress an extreme change of color and smoothly change the color in the adjacent patch.

FIG. 22(b) shows that since the texture coordinate systems of the patch WA as the object to be processed and the adjacent patch WB (a broken line) are different from each other, when a projection on the texture coordinate system of the adjacent patch WB is developed to the patch WA as the object to be processed, the texture GB projected on the same point (a vertex P) is different from the texture GA projected on the texture coordinate system of the patch WA as the object to be processed.

In step 503, one of the patches adjacent to the patch WA as the object to be processed is selected and the vertexes on the borderline of the adjacent patch WB are read from the processed data storing part 14. The patch WB read in the step 503 is read in order of large data capacity in the same way as described above.

Since the vertexes on the borderlines between the adjacent patches undergo the vertex coincidence process, when the vertexes on the borderline of the patch WA are compared with the vertexes on the borderline of the patch WB, the duplicated vertexes on the same position are identified as the vertexes located on the common borderline between the patch WA and the patch WB.

Figure 23:
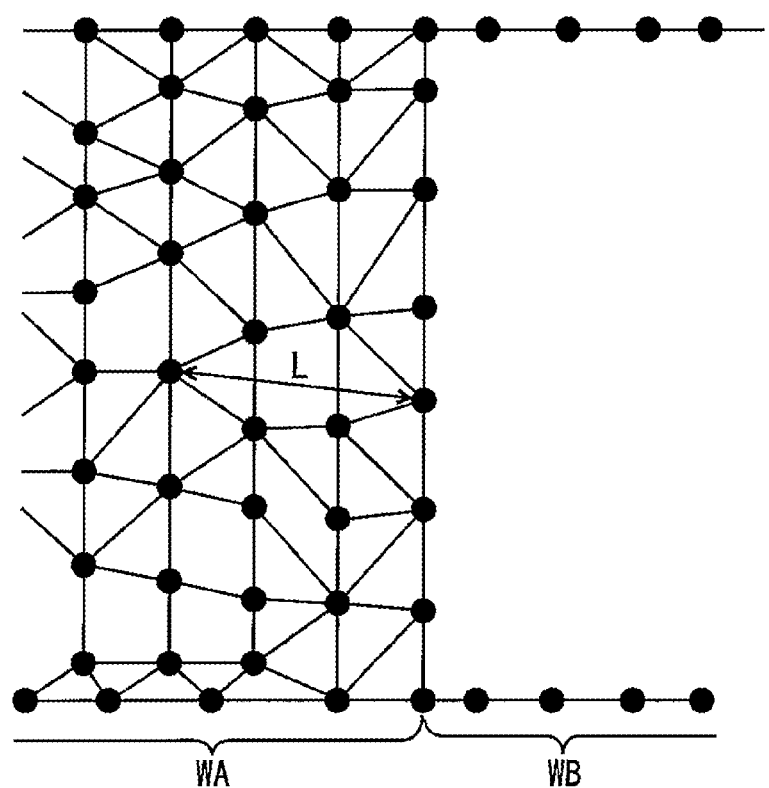
FIG. 23 is a diagram showing the shortest distance between a vertex of the patch and a vertex on the borderline.

In step 504, are calculated the shortest distances L between all the vertexes of the patch WA and the vertexes on the borderline between the patch WA and the patch WB which are identified in the previous step 503. The shortest distance indicates, as shown in FIG. 23, a distance of a straight line between the two vertexes.

Then, in step 505, for the vertexes the shortest distances L of which are smaller than a prescribed value Lmax, color information projected on a texture coordinate system set by using a mean normal of the patch WB is obtained and mixed with the color information projected on the texture coordinate system set by using the mean normal of the patch WA and already added in the step 502. A mixed result is overwritten on the already added color information.

Figure 24:
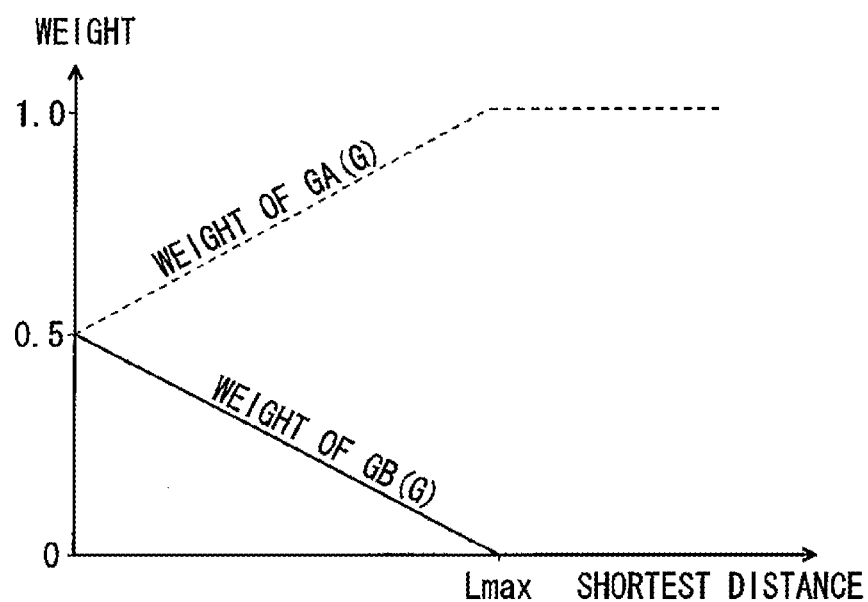
FIG. 24 is an explanatory view showing a mixing method of colors.

Here, as shown in FIG. 24, the color information to be mixed is designated as pixel values of the vertexes located within a range of Lmax. In the shortest distance L=0 (on the borderline), the pixel value GA(g) of the texture GA of the patch WA as the object to be processed and the pixel value GB(g) of the texture GB of the adjacent patch WB are respectively set to 50%. Further, as the shortest distance L is larger, a rate of the pixel value GA(g) is more increased and a rate of the pixel value GB(g) is more decreased. In the vertex located at the position of Lmax, a rate of the pixel value GA(g) is set to 100% and a rate of the pixel value GB(g) is set to 0%.

Namely, the pixel values GR of the vertexes after a mixing process are respectively expressed by a below-described equation.

$$GR(g)=GA(g)(L\text{max}+L)/2L\text{max}+GB(g)(L\text{max}-L)/2L\text{max}$$

In step 506, it is checked whether or not the color mixing processes with all the adjacent patches WB is finished for the patch WA as the object to be processed.

When the patch remains in which the color mixing process is not yet finished (step 506: No), the procedure returns to the step 503 to repeat the color mixing process with the adjacent patch WB having secondly large data capacity.

When the color mixing processes with all the adjacent patches WB are finished (step 506: Yes), the procedure advances to step 507.

In the step 507, normal information of the vertexes on the borderline of the normal lines of the patch WA as the object to be processed which are calculated in the step 501 is stored in the global coordinate file.

In step 508, it is checked whether or not there is the adjacent patch WB in which the color information is applied to all the vertexes and the mixing process is finished.

When the adjacent patch in which the mixing process is finished is not yet present (step 508: No), the procedure advances to step 513. When there is the adjacent patch in which the mixing process is finished (step 508: Yes), the procedure advances to step 509.

In the step 513, the patch WA as the object to be processed is stored in the processed data storing part 14. Thus, the patch WA of the processed data storing part 14 is replaced by data to which the color information is added.

In the step 509, the normal coincidence processing part 33c reads normal information (normal directions) of the vertexes on the borderline of the patch WB in which the mixing process is finished. This normal information is added to attribute information thereof in the step 501 when the patch WB is a patch of an object to be processed.

In step 510, the vertexes on the borderline of the patch WA which correspond to the vertexes on the borderline of the patch WB are searched from the global coordinate file.

In step 511, the normal lines of the vertexes of the patch WA which correspond to the vertexes of the patch WB are replaced by normal lines of the corresponding vertexes of the patch WE to set them as new normal lines of the vertexes of the patch WA.

In step 512, in relation to all the patches WB with the adjacent relation to the patch WA and the mixing process finished, it is checked whether or not a replacement process of the normal lines of the patch WA as the object to be processed is finished. When the adjacent patch WB remains in which the replacement process of the normal lines of the patch WA is not yet finished (step 512: No), the procedure returns to the step 509.

When the replacement process of the normal lines of the patch WA is finished for all the adjacent patches WB having the mixing process finished (step 512: Yes), the procedure advances to the step 513 to store the patch WA as the object to be processed in the processed data storing part 14. In the operation memory 35, the patch WA as the object to be processed is left.

In the check of the step 508, when the adjacent patch WE in which the mixing process is finished is not yet present, that is, when the patch WA is, for instance, a first patch as an object to be processed, since a mate does not exist to which the normal lines are to be allowed to correspond, the procedure directly advances to the step 513 by leaving the normal lines obtained in the step 501 as they are. Subsequently, during a process of other patch, the patch is read as the adjacent patch WB in the step 509 to be an object that the normal lines of the vertexes on the borderline of other patch in question are allowed to correspond thereto.

The processes described above so far correspond to the texture mapping carried out by the texture combining part 33. Below-described processes correspond to the displacement mapping carried out by the crimp combining part 34.

A curved surface p' displaced by the displacement mapping is expressed by an equation (1).

$$P'(u,v)=p(u,v)+h(u,v)q(u,v) \qquad (1)$$

Figure 25:
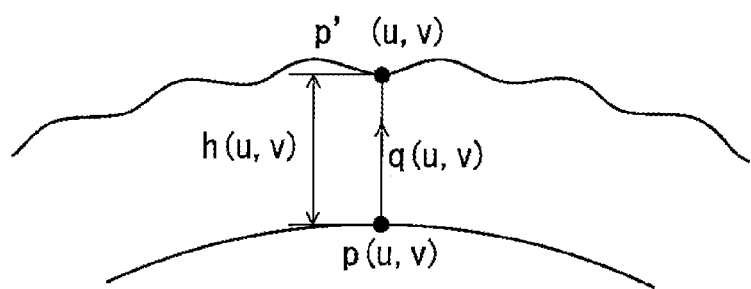
FIG. 25 is an explanatory view showing a concept of the displacement mapping.

Here, as shown in FIG. 25, p(u, v) designates a curved surface (a base curved surface) before a displacement. h(u, v) designates a displacement. q(u, v) designates a unit vector in a displacing direction.

Accordingly, here, the vertexes pc located at positions of p(u, v) in the polygon mesh are displaced in accordance with the above-described equation.

Now, returning to the flowcharts of FIG. 19 to FIG. 21, in step 514, the vertex displacing part 34a selects one of the vertexes pc of the triangular polygon mesh Qc of the patch WA to read the normal direction of the vertex. A position of the selected vertex is arbitrary.

The normal direction is a unit vector q when the vertex is displaced afterward and when the drawing gradient is calculated In step 515, a reference displacement of the vertex is obtained in accordance with a conversion rate of the color information (the pixel value g) as the attribute information of the vertex and a depth of the crimp.

When it is assumed that a maximum depth of the crimp, namely, a maximum displacement is $h_{max}$, the conversion rate is $h_{max}/255$ and the reference displacement h is expressed by an equation (2) from the pixel value g.

$$h=(g/255)h_{max} \qquad (2)$$

For instance, when $h_{max}$ is 300 μm, if the pixel value g is 128, the reference displacement h is 150 μm.

In subsequent step 516, the drawing gradient of the metal mold as an object to be worked is calculated in accordance with the mold opening direction of the metal mold as the object to be worked and the normal direction of the coordinate of the vertex. The mold opening direction is a previously set condition and stored in the input data storing part 12.

Then, in step 517, in accordance with a change equation of the depth of the crimp relative to the drawing gradient selected at the time of starting a process, the rate of reduction of displacement in the position of the vertex is calculated.

Figure 26:
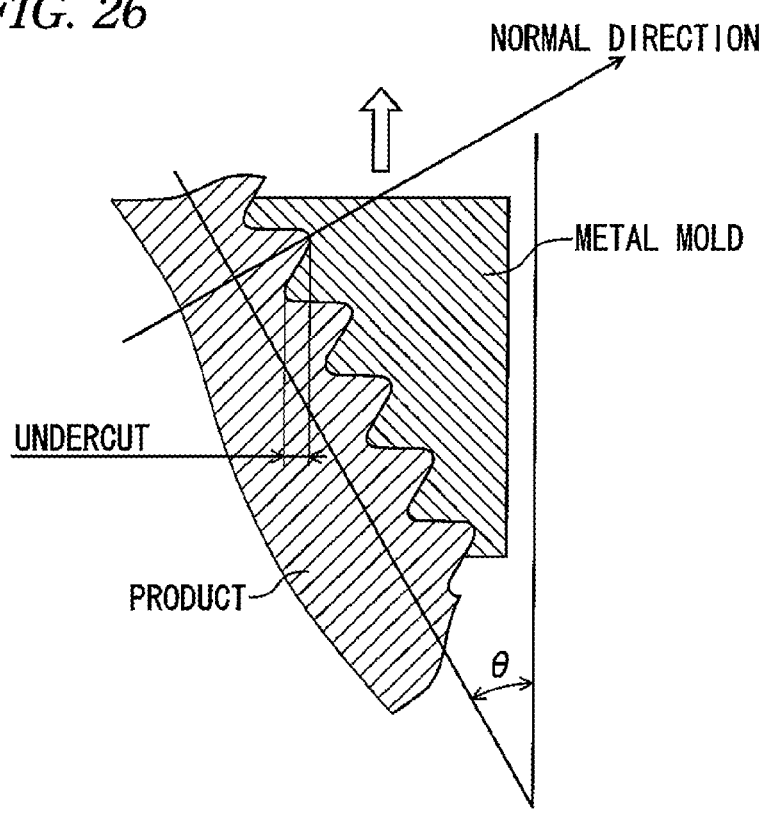
FIG. 26 is an explanatory view showing an interference of a metal mold with a product due to a drawing gradient.
Figure 27:
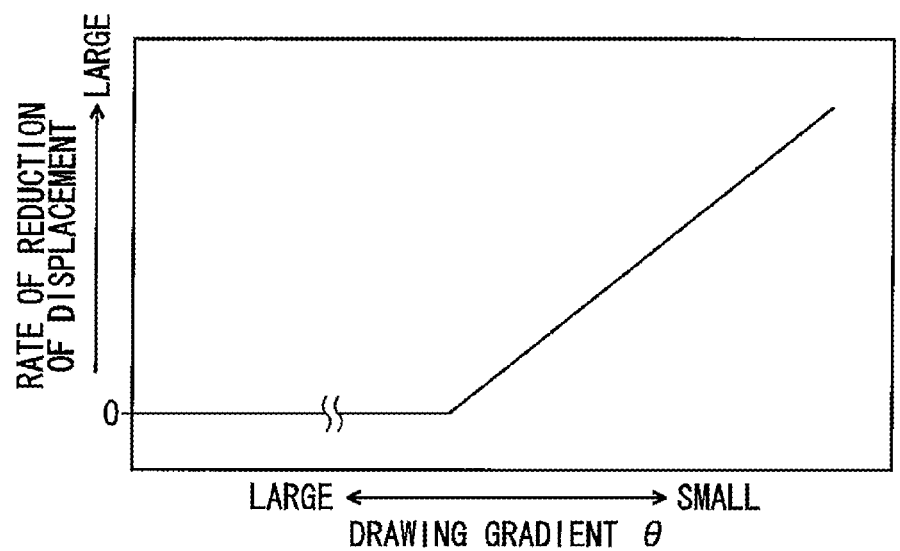
FIG. 27 is a relation view of the drawing gradient and a rate of reduction of displacement showing a concept of a change expression.

As shown in FIG. 26, when it is assumed that the drawing gradient is an angle θ formed by a line of 90% relative to the normal direction of the vertex and the mold opening direction shown by a void arrow mark, as the drawing gradient is smaller, the larger undercut is formed so that the metal mold interferes with the crimp of a product side during a mold opening process. Accordingly, to prevent the undercut from being formed, the change equation is set as shown in FIG. 27 so that as the drawing gradient θ is smaller, the rate of reduction of displacement is the larger, namely, as the drawing gradient θ is smaller, the displacement is the smaller. At this time, the change equation is determined by considering that an actual degree of an interference of the metal mold and the product is slightly mitigated due to the shrinkage of a molded resin. The rate of reduction of displacement is continuously changed depending on the drawing gradient.

In step 518, the reference displacement h is multiplied by the rate of reduction of displacement to calculate a final displacement.

Thus, for instance, when the reference displacement h is 200 μm, if the drawing gradient is larger than 25°, the rate of reduction of displacement is set to 0% so that the final displacement hf is 200 μm as it is. When the drawing gradient is located within a range of 0° to 25°, the rate of reduction of displacement is set to 90 to 0% so that the final displacement may be changed from 20 μm to 200 μm.

In step 519, the final displacement hf obtained as described above is designated as h(u, v) and the unit vector q (the normal direction) is used to displace the vertex pc of the polygon mesh in accordance with the above-described equation (1).

Then, in step 520, it is checked whether or not the vertex remains in which the above-described processes are not yet carried out.

When the vertex remains which does not undergo the above-described processes (step 520: No), the procedure returns to the step 514 to repeat the processes to the step 519.

When the displacement of all the vertexes in the normal directions based on the texture data is finished (step 520: Yes), the step 520 advances to step 521. The crimp applied polygon mesh forming part 34b connects the vertexes pc located at new displaced positions together to form a polygon mesh QT to which the crimp configurations are applied. In step 522, data of the polygon mesh QT is stored in the polygon data storing part 19 and erased from the operation memory 35.

By the above-described processes, a process for applying the crimp configurations to the patch WA as the one object to be processed is finished.

After that, in the step 107, it is checked whether or not the process for applying the crimp configurations to all the patches is finished. When the patch remains in which the process for applying the crimp configurations is not yet finished (step 107: No), the procedure returns to the step 500 to read the patch WA as a new object to be processed in order of large data capacity set in the step 300 from the processed data storing part 14 and repeat the processes to the step 522.

When the above-described processes are finished for all the patches (step 107: Yes), the monitor 23 is allowed to display a completion of the processes (step 108) and complete the process for forming the crimp applied polygon data.

Figure 28:
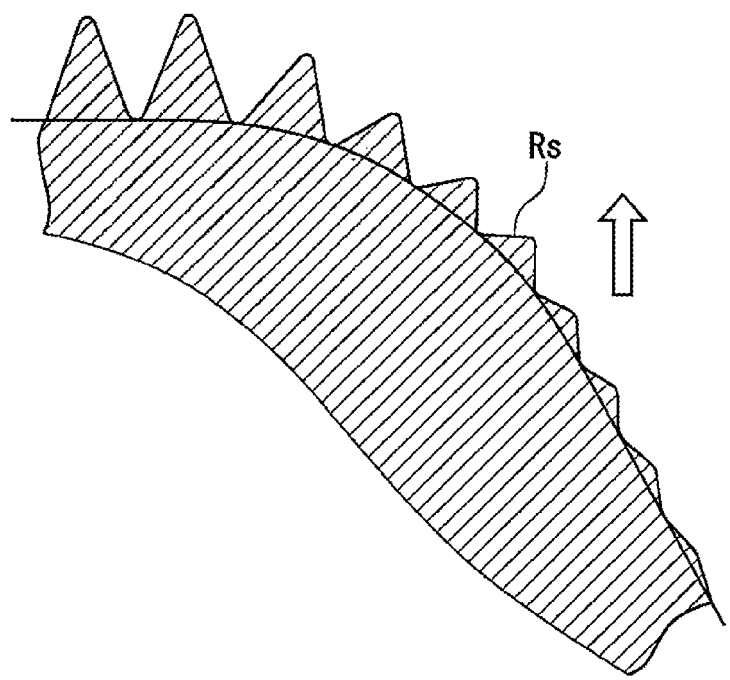
FIG. 28 is a diagram showing a change of depths of crimps to which the reduction of displacement is applied.

By this polygon data, as shown in FIG. 28, the product can be obtained in which the depths (heights) of the crimps Rs successively change without generating the undercut between the metal mold and the product due to the above-described reduction of displacement in a part of a small drawing gradient. In the drawing, a void arrow mark designates the mold opening direction.

In the present exemplary embodiment, the step 100 (the steps 200 to 209) in the flowchart is carried out by the polygon mesh forming part 30 in the present invention. The step 102 (the steps 300 to 308) is carried out by the adjacent relation search part 31a. The step 103 (the steps 400 to 407) is carried out by the configuration continuity processing part 31b.

Further, the step 105 (the steps 500 to 513) is carried out by the texture integrating part 33. Especially, the steps 503 to 506 are carried out by the texture mixing part 33b. The steps 509 to 512 are carried out by the normal coincidence processing part 33c.

Further, the steps 514 to 520 are carried out by the vertex displacing part 34a. The step 521 is carried out by the crimp applied polygon mesh forming part 34b.

The exemplary embodiment is formed as described above. Initially, the polygon mesh Qc is formed for each of patch units which are obtained by dividing into a plurality of parts the product shaped data defined as the free curved surface J as the object to which the crimps are applied. One of the patches WA is set as an object to be processed and the vertexes on the borderlines of the patch WA and the patch WB are allowed to respectively correspond to each other so that the polygon meshes Qc are sequentially continuous between the patch WA and the one adjacent patch WB.

Then, the texture based on the texture data is mapped on the patch WA. The vertexes of the patch WA are respectively displaced in their normal directions in accordance with the texture mapped on the patch to form a new polygon mesh QT in accordance with the displaced vertexes respectively. The above-described processes are sequentially repeated to the patches respectively set as objects to be processed. Thus, the surface treatment data to which the crimps are applied is obtained for the polygon meshes QT of all the patches.

According to the surface treatment data forming device of the present exemplary embodiment, only one patch WA is set as the object to be processed respectively in the stages of the processes. Further, even when there is a plurality of patches WB adjacent to the patch WA as the object to be processed, the adjacent patches WB are read one by one as required and processed. Namely, only the polygon mesh data of the two patches including the patch WA as the object to be processed and the one adjacent patch WB is stored in the operation memory 35 of the data processing part 13 at a time. Accordingly, since a large quantity of data is not stored in the memory, there is no fear that data exceeds a quantity which the memory can store to extremely lower a processing speed of a computer or freeze the computer.

When product shaped data is changed to the polygon mesh, in a parameter space of the free curved surface of each of the patches W obtained by dividing the product shaped data into a plurality of parts, the grid points are formed by the prescribed partition lines. Further, the sequence of points is formed with prescribed spaces on the borderline of the patch. Thus, a three-dimensional polygon mesh Qc is formed which has the vertexes respectively located on the free curved surface by using the grid points located inside the borderline and the sequence of points.

Especially, the partition lines forming the grid points and the sequence of points respectively have equalized spaces within a prescribed range. Further, the three-dimensional polygon mesh Qc is formed in such a way that the grid points located inside the borderline are connected together to form the grid mesh, the triangular polygons are formed from the grid mesh and the grid points located on the outer periphery of the grid mesh are connected to the sequence of points on the borderline to form the triangular polygons. Namely, since a projection on a two-dimensional plane and a restoring process to a three-dimensional plane are not carried out, a burden of calculation is reduced and a processing time is shortened. Further, a distortion or skew due to the two-dimensional and three-dimensional processes does not occur. Since the three-dimensional polygon mesh is divided into the patches, the crimps having little distortion or skew and good in outward appearance can be applied even to the configuration of the product the surface of which is not an applicable surface.

Further, since the adjacent relation between the patches is set by searching whether or not the vertexes on the borderline of the one patch are overlapped on the poly-line formed by using the sequence of vertexes on the borderline of other patch, even when the adjacent relation is not added to the data of the patch inputted to the data input part 11, the adjacent relation between the patches can be simply decided.

Since the search of the adjacent relation between the patches is processed by selecting the patch in order of large quantity of data of the polygon meshes, the patch to which the patch large in data quantity is adjacent is avoided from being read to the operation memory many times, so that a processing speed is improved. The above-described matter is applied respectively to the processes after the vertex coincidence process.

Then, since the process is carried out in which the vertexes on the borderlines BOA and BOB are allowed to correspond to each other between the two patches WA and WB having the adjacent relation, the sequences of vertexes on the borderlines are shared as the same positions between the patches. Thus, the patches are smoothly connected together without a break.

Specifically, at the same position as that of the vertex on the borderline of one of the patch WA and the patch WB, a new vertex is formed on the other borderline. Otherwise, the vertex on the one borderline and the vertex on the other borderline are respectively moved to the same position as an intermediate position between them and allowed to correspond to each other. Accordingly, a joint is not formed in an extremely fine mesh or rough mesh.

The texture data is the image data in which the pixel values obtained by assigning the depths of the crimps in two-dimensional position coordinates to the gradations of densities are taken as texture values. Since the texture data itself can express the texture by a small quantity of data, a data process is simplified.

As for the mapping of the texture on the patch, the texture coordinate system is set by using the mean normal of each of the patches. All the vertexes of the patch WA as the object to be processed are projected on the texture coordinate system of the patch WA to obtain the texture values (GA). Especially, for the vertexes which have the shortest distances L from the vertexes on the borderline of the adjacent patch WB located within Lmax, since the texture values (GB) are obtained by a profection on the texture coordinate system of the patch WB and both the texture values are mixed together. Thus, a discontinuity of the texture values is mitigated.

Then, since the texture values are mixed together by applying a weight to the shortest distance L from the vertex on the borderline, a change of the textures is smooth. Further, since the normal lines of the vertexes of the patch WA are allowed to correspond to the normal lines of the vertexes of the adjacent patch WB, an odd impression does not arise in a joint of the patches.

As for the vertexes on the borderline common to the adjacent patch WE when the shortest distances L are obtained in the patch WA, when the vertexes located on the borderline of the adjacent patch WB are referred to, can be identified which of the vertexes on the borderline of the patch WA is located on the borderline between the patch WB and the patch WA without the attribute information, because the vertex coincidence process is carried out and the vertexes of the patch WA are duplicated on the vertexes of the patch WE side.

In the process of the crimp generating part 34, the displacement that the vertexes of the triangular polygon mesh Qc are respectively displaced is obtained by multiplying the reference displacement based on the texture by the rate of reduction of displacement depending on the drawing gradient of the metal mold. Accordingly, in the crimps worked by the obtained surface treatment data, the undercut is not generated and the depths of the crimps are smoothly changed, so that the outer surface good in its external appearance is obtained.

In the exemplary embodiment, the example is described in which the B-spline curved line is used as the free curved line of the borderline, however, other free curved lines may be likewise applied to the present invention.

Further, as for the adjacent relation between the patches W, the adjacent relation is set by searching, after the polygon mesh is formed, whether or not the vertexes on the borderline of the one patch are overlapped on the poly-line formed by using the sequence of vertexes on the borderline of the other patch. However, to data obtained when the patch is divided, information of the adjacent relation may be previously added.

The texture data is provided as the gray scale image data of 256 gradations, however, the present invention is not limited thereto and image data may be used that has depth information of the crimps provided in the densities of a plurality of color components.

Further, in the texture mapping, the pixel values are mixed together by using the texture coordinate system of the adjacent patch. However, when the textures are sufficiently smoothly connected together due to the properties of the textures or a fineness of the polygon mesh, the mixing process of the pixel values may be omitted.

In the displacement mapping of the crimp pattern, the rate of reduction is continuously changed for the reduction of the displacement to the drawing gradient. However, it is to be understood that the rate of reduction may be intentionally gradually changed in arbitrary steps.

The present invention is described in detail by referring to the specific exemplary embodiment. However, it is to be understood to a person with ordinary skill in the art that various changes or modifications may be added without deviating from the spirit and scope of the present invention.

This application is based on Japanese Patent Application (JPA. No. 2011-050153) filed on Mar. 8, 2011 and contents thereof are incorporated herein as a reference.

INDUSTRIAL APPLICABILITY

The present invention is used in the field of manufacturing of various kinds of resin products having crimp patterns on the surfaces of products and great advantages can be obtained.

DESCRIPTION OF REFERENCE NUMERALS

10 . . . surface treatment data forming device
11 . . . data input part
12 . . . input data storing part
13 . . . data processing part
14 . . . processed data storing part
19 . . . polygon data storing part 20 . . . data output part
22 . . . operation input part
23 . . . monitor
30 . . . polygon mesh forming part
31 . . . polygon mesh integrating part
33 . . . texture combining part
34 . . . crimp generating part
35 . . . operation memory
b . . . space upper limit value
Ca, Ca1, Ca2, Ca3, Ca4 . . . grid point
Cb . . . sequence of points
Cb1, Cb2, Cb3, Cb4 . . . point
GA, GB . . . projected texture
J . . . free curved surface
K, BOA, BOB . . . borderline
L . . . shortest distance
N . . . target point
PA, PA', PB, PB' . . . sequence of vertexes
Pa1, Pa2, Pa3, Pa4, Pa5, Pax, Pay . . . vertex Pbq1, Pb2, Pb3, Pb4, Pb5, Pb6, Pbx . . . vertex
pc . . . vertex
Qc . . . triangular polygon mesh
QT . . . polygon mesh
R1, R2 . . . edge line
Sqc . . . square grid mesh
Tpc . . . triangular polygon
W, WA, WB . . . patch
Δ1, Δ2 . . . triangle

The invention claimed is:

1. A method for forming surface treatment data by a computer, comprising:
a polygon mesh forming process in which a polygon mesh is formed for each of patch units obtained by dividing into a plurality of parts product shaped data defined as free curved surfaces as an object to which crimps are applied;
a configuration continuity forming process in which one patch of the plurality of patches is selected as an object to be processed and the polygon mesh is allowed to be sequentially continuous between the patch as the object to be processed and the adjacent patches one by one;
a mapping process in which a texture based on texture data is mapped on the patch as the object to be processed;
a vertex displacing process in which vertexes of the patch as the object to be processed are respectively displaced in their normal directions in accordance with the texture mapped on the patch; and
a crimp applied polygon mesh data forming process in which new polygon mesh data is formed in accordance with the displaced vertexes respectively, characterized in that the configuration continuity forming process to the crimp applied polygon mesh data forming process are carried out for the patch unit, in which data of each patch unit is sequentially read in an operation memory and processed one by one, and are repeated to form the surface treatment data for each of patch units including the crimp applied polygon mesh data,
wherein a texture coordinate system is set for each of the patches by using its mean normal before the mapping process, and in the mapping process,
all the vertexes of the patch as the object to be processed are projected on the texture coordinate system of the patch to obtain the texture values,
the vertexes located in a prescribed range in the patch as the object to be processed are projected on the texture coordinate system of the patch adjacent to the patch as the object to be processed to obtain the texture values and both the texture values are mixed together.

2. The method for forming surface treatment data according to claim 1, wherein whether or not the vertexes on a borderline of the one patch formed as the polygon mesh are overlapped on a poly-line formed by using a sequence of vertexes on a borderline of other patch is searched in the configuration continuity forming process, and when the vertexes on the borderline of the one patch are overlapped on the poly-line, an adjacent relation is set between them.

3. The method for forming surface treatment data according to claim 1, wherein the texture data is image data in which pixel values obtained by assigning depths of crimps in two-dimensional position coordinates to the gradations of densities are taken as texture values.

4. The method for forming surface treatment data according to claim 1, wherein the vertexes located in the prescribed range indicate vertexes the shortest distances of which to vertexes of a borderline to the adjacent patch are situated within prescribed values.

5. The method for forming surface treatment data according to claim 4, wherein the texture values are mixed together by applying a weight in the shortest distances.

6. The method for forming surface treatment data according to claim 4, wherein positions of the vertexes on the borderlines between the patch as the object to be processed and the adjacent patch are respectively allowed to coincide with each other.

7. The method for forming surface treatment data according to claim 6, wherein for the coincidence of the vertexes, at the same position as that of the vertex on one borderline of the patch as the object to be processed and the adjacent patch, the vertex is formed on the other borderline, or the vertex on the one borderline and the vertex on the other borderline are respectively moved to the same position, so that the vertexes are allowed to coincide with each other.

8. The method for forming surface treatment data according to claim 6, wherein the vertex on the borderline to the adjacent patch as the object the shortest distance of which is obtained is identified by referring to the vertex located on the borderline of the adjacent patch.

9. The method for forming surface treatment data according to claim 6, wherein normal lines of the vertexes the positions of which are allowed to coincide with each other on the borderlines between the patch as the object to be processed and the adjacent patch are allowed to correspond to each other between the patch as the object to be processed and the adjacent patch.

10. The method for forming surface treatment data according to claim 9, wherein the normal lines of the vertexes of the patch as the object to be processed are allowed to correspond to the normal lines of the vertexes of the adjacent patch.

11. The method for forming surface treatment data according to claim 1, wherein the patch as the object to be processed is selected in order of large data quantity of the polygon meshes.

12. The method for forming surface treatment data according to claim 11, wherein the adjacent patch of the patches having the adjacent relation to the one patch as the object to be processed is selected in order of large data quantity of the polygon meshes.

13. A device for forming surface treatment data comprising:
a computer that comprises:
a data input part to which product shaped data defined as free curved surfaces of an object to which crimps are applied and texture data are inputted;
a polygon mesh forming part that forms a polygon mesh for each of patch units obtained by dividing the product shaped data into a plurality of parts;
an adjacent relation search part that searches an adjacent relation between the patches,
a configuration continuity processing part that sets one patch as an object to be processed and a process is carried out for allowing the polygon mesh to be continuous between the patch as the object to be processed and the adjacent patches one by one for each combination unit including the patch as the object to be processed and the one adjacent patch;
a texture combining part that maps a texture on the patch;
a vertex displacing part that displaces vertexes of the polygon mesh of the path in their normal directions in accordance with the texture mapped on the patch; and
a crimp applied polygon mesh forming part that connects the vertexes displaced by the vertex displacing part to form a crimp applied polygon mesh including crimp configurations, characterized in that data of the crimp applied polygon mesh is connected for the patch unit, in which data of each patch unit is sequentially read in an operation memory and processed one by one, and is outputted as the surface treatment data for each of the patch units,
wherein a texture coordinate system is set for each of the patches by using its mean normal before the mapping process, and in the mapping process,
all the vertexes of the patch as the object to be processed are projected on the texture coordinate system of the patch to obtain the texture values,
the vertexes located in a prescribed range in the patch as the object to be processed are projected on the texture coordinate system of the patch adjacent to the patch as the object to be processed to obtain the texture values and both the texture values are mixed together.

14. The device for forming surface treatment data according to claim 13, wherein the vertexes respectively located on borderlines between the patch as the object to be processed and the adjacent patch are allowed to coincide with each other.

15. The device for forming surface treatment data according to claim 13, wherein the texture combining part includes a texture mixing part which mixes textures together for the patch as the object to be processed located within a prescribed range from the borderlines of the patch as the object to be processed and the adjacent patch respectively in accordance with texture coordinate systems of the patch as the object to be processed and the adjacent patch.

16. The device for forming surface treatment data according to claim 13, wherein the mapping part includes a normal coincidence processing part which allows normal lines of the vertexes of the patch as the object to be processed to correspond to normal lines of the vertexes of the adjacent patch.

* * * * *